United States Patent
Katrašnik et al.

(10) Patent No.: US 11,480,616 B2
(45) Date of Patent: Oct. 25, 2022

(54) COMPUTER-IMPLEMENTED METHOD AND DATA PROCESSING SYSTEM FOR MODELLING AND/OR SIMULATING AND/OR EMULATING A BATTERY

(71) Applicant: Univerza V Ljubljani, Ljubljana (SI)

(72) Inventors: Tomaž Katrašnik, Maribor (SI); Klemen Zelic, Ljubljana (SI); Amer Amor Chowdhury Haque, Kamnica (SI); Ivo Pacnik, Prevalje (SI); Igor Mele, Borovnica (SI); Andraž Kravos, Ajdovščina (SI)

(73) Assignee: Univerza V Ljubljani, Ljubljana (SI)

( * ) Notice: Subject to any disclaimer, the term of this patent is extended or adjusted under 35 U.S.C. 154(b) by 0 days.

(21) Appl. No.: 17/721,625

(22) Filed: Apr. 15, 2022

(65) Prior Publication Data

US 2022/0252672 A1 Aug. 11, 2022

Related U.S. Application Data

(63) Continuation of application No. PCT/EP2021/077079, filed on Oct. 1, 2021.

(30) Foreign Application Priority Data

Oct. 2, 2020 (EP) .................................... 20199967

(51) Int. Cl.
*G01R 31/367* (2019.01)
*G06F 30/33* (2020.01)

(52) U.S. Cl.
CPC ........... *G01R 31/367* (2019.01); *G06F 30/33* (2020.01)

(58) Field of Classification Search
CPC .............................. G01R 31/367; G06F 30/33
See application file for complete search history.

(56) References Cited

U.S. PATENT DOCUMENTS

| 10,132,869 B2 | 11/2018 | Joe |
| 2008/0238430 A1 | 10/2008 | Page et al. |

(Continued)

FOREIGN PATENT DOCUMENTS

| GB | 2463297 A | * | 3/2010 | ........... G01R 31/361 |
| JP | 2015527566 A | | 9/2015 | |

(Continued)

OTHER PUBLICATIONS

International Search Report and Written Opinion dated Nov. 4, 2021, for priority International Patent Application No. PCT/EP2021/077079.

(Continued)

*Primary Examiner* — Stacy Whitmore
(74) *Attorney, Agent, or Firm* — Renner, Otto, Boisselle & Sklar, LLP

(57) ABSTRACT

A method for modeling, simulating, or emulating a battery may include generating an equivalent electric circuit model of a battery. The equivalent electric circuit model may include models of the battery's cathode and anode. At least one of the models of the cathode and anode may comprise one or more sub-circuit models. A sub-circuit model may comprise a first current inlet, a second current inlet, at least one voltage source, one or more resistors, and a capacitance. A first current path may be arranged between the first current inlet and the second current inlet. The at least one voltage source and the one or more resistors may be arranged in series in the first current path. A second current path may be arranged in parallel to the first current path between the first current inlet and the second current inlet. The capacitance may be arranged in the second current path.

18 Claims, 19 Drawing Sheets

(56) References Cited

U.S. PATENT DOCUMENTS

2014/0358459 A1* 12/2014 Trnka ............... G01R 31/367
                                                      324/426
2018/0100898 A1* 4/2018 Benosman ............ B60L 58/15

FOREIGN PATENT DOCUMENTS

| JP | 2017501374 A | 1/2017 |
| WO | 2010/029355 A2 | 3/2010 |
| WO | 2016/151336 A1 | 9/2016 |
| WO | 2020/129477 A1 | 6/2020 |

OTHER PUBLICATIONS

Search Report and Written Opinion dated Jul. 1, 2021, for priority Luxembourg Patent Application No. LU102115.

Hui Pang et al.; A Comprehensive Physics-Based Equivalent-Circuit Model and State of Charge Estimation for Lithium-Ion Batteries; Journal of the Electrochemical Society; 2021; vol. 168; The Electrochemical Society.

Yang Li et al.; A physics-based distributed-parameter equivalent circuit model for lithium-ion batteries; Electrochimica Acta; 2019; pp. 451-469.

Yang Li et al.; Adaptive Ensemble-Based Electrochemical-Thermal-Degradation State Estimation of Lithium-Ion Batters; IEEE Transactions on Industrial Electronics; Jul. 21, 2021; pp. 1-12.

Zeyang Geng et al.; Bridging physics-based and equivalent circuit models for lithium-ion batteries; Elecliochimica Acta; 2021; vol. 372; pp. 1-9.

Janina Costard et al.; Charge Transfer Parameters of NixMnyCo1-x-y Cathodes Evaluated by a Transmission Line Modeling Approach; Energy Technology; 2021; pp. 1-10; Advanced Science News.

M. Urbain et al.; State Estimation of a Lithium-Ion Battery Through Kalman Filter; 2007; pp. 2804-2810.

Marie-Therese Von Srbik et al.; A physically meaningful equivalent circuit network model of a lithium-ion battery accounting for local electrochemical and thermal behaviour, variable double layer capacitance and degradation; Journal of Power Sources 325; 2016; pp. 171-184.

* cited by examiner

| Symbol | Physical meaning |
|---|---|
| $a$ | specific (volumetric) active particle surface |
| $\tilde{C}_{DL}$ | Double layer capacitance |
| $c_{ely}$ | Li$^+$ concentration in electrolyte |
| $c_s$ | Li concentration in active material |
| $c_s^0$ | Surface concentration of Li in active material |
| $D_{ely}^{eff}$ | effective diffusion coefficient of Li in electrolyte |
| $D_s$ | diffusion coefficient of Li in active material |
| $\varepsilon$ | porosity |
| $\eta$ | overpotential |
| $f_\pm$ | activity coefficient in electrolyte |
| $\phi_{ely}$ | electric potential of electrolyte |
| $\phi_s$ | electric potential of carbon black |
| $F$ | Faraday constant |
| $j_0$ | Butler - Volmer exchange current Li at electrolyte/active material interface |
| $j^{BV}$ | Butler - Volmer molar flux of Li at electrolyte/active material interface |
| $j^{DL}$ | Double layer molar flux of Li at electrolyte/active material surface |
| $j^{TOT}$ | molar flux of Li at electrolyte/ active material surface |
| $L_p$ | active particle size |
| $\kappa_{ely}^{eff}$ | effective ionic conductivity of electrolyte |
| $\mu(c_s)$ | concentration dependent part of chemical potential |
| $R$ | gas constant |
| $\sigma^{eff}$ | effective electron conductivity of electrode material |
| $T$ | temperature |
| $t$ | time |
| $t_+$ | transference number of electrolyte |
| $U_{OCV}$ | Open circuit voltage corresponding to chemical potential difference at standard conditions |
| $\tilde{U}_{OCV}$ | open circuit voltage |
| $x$ | coordinate along electrode thickness |
| $z$ | coordinate along active particle length |

Figure 2

COMPUTER-IMPLEMENTED METHOD AND DATA PROCESSING SYSTEM FOR MODELLING AND/OR SIMULATING AND/OR EMULATING A BATTERY

This application is a continuation of International Application No. PCT/EP2021/077079 filed Oct. 1, 2021, which claims priority to European Application No. 20199967.9 filed Oct. 2, 2020, and Luxembourgish Application No. LU102115 filed Oct. 3, 2020, the entire disclosures of which are hereby incorporated by reference.

The present invention relates to a computer-implemented method and data processing system for modelling and/or simulating and/or emulating a battery.

Batteries are used in a great variety of technical products, for example in mobile electric devices, such as smartphones, tablets, etc., or in electrical vehicles. In such products, the batteries serve as electrical power sources.

It can also be beneficial to be able to model and/or simulate a battery or its behavior, for example in order to obtain a more profound understanding of properties of batteries, or in order to estimate or predict a property of a battery, such as its state of health (SOH) or state of charge (SOC).

WO 2016/151336 A1 describes a method for determining a characteristic of a battery.

It is an object of the present invention to provide an improved method for modelling and/or simulating a battery.

The object is satisfied by a method in accordance with claim 1. Preferred embodiments of the present invention are described in the dependent claims.

In some embodiments, the invention relates to a computer-implemented method for modelling and/or simulating and/or emulating a battery, the method comprising: generating an equivalent electric circuit model of a battery, wherein the equivalent electric circuit model includes a model of a cathode of the battery, and a model of an anode of the battery, wherein at least one of the models of the cathode and anode and preferably both, the model of the cathode and the model of the anode comprise one or more sub-circuit models, and wherein a sub-circuit model comprises a first current inlet, a second current inlet, at least one voltage source, one or more resistors, and a capacitance, wherein a first current path is arranged between the first current inlet and the second current inlet, wherein the at least one voltage source and the one or more resistors are arranged in series in the first current path, wherein a second current path is arranged in parallel to the first current path between the first current inlet and the second current inlet, and wherein the capacitance is arranged in the second current path.

The method allows examining batteries based on an equivalent electric circuit model, which represents the battery in form of a computer-implemented model of an electric circuit that includes circuit elements, such as the mentioned voltage source, resistor, capacitance and inductor. In particular, the equivalent electric circuit model can be derived in such a way that it is consistent with physiochemical processes in the real battery. Thus, also consistency with electrochemical models can be achieved. Due to a possible consistency with physiochemical processes in real batteries, elements of the equivalent circuit model, which virtually represents the battery, can replicate specific processes in batteries, and due to a possible consistency with electrochemical models, circuit elements of such an equivalent circuit can be analytically derived from parameters that are related to material and topological as well as geometrical characteristics of the battery cells.

An exemplary electric circuit model is shown in FIG. 19, where mapping between real topological representation of the battery and topology of the equivalent circuit model is presented. This mapping can determine basic sub-circuit models of the equivalent circuit model. The main sub-circuit models that can constitute the equivalent circuit model are: active material, electron conductive material and electrolyte as well as the interface between them in at least one electrode and separator between the electrodes as well as current collector and the load. These component specific sub-circuit models can be composed of such electrical elements to ensure credible virtual representation of physiochemical processes in real batteries.

Specific sub-circuit models can inherently comprise process specific electrical components, which can be mandatory for credible virtual representation of physiochemical processes in real batteries, whereas certain components might be added to these mandatory components to further refine fidelity of the sub-circuit models while simultaneously complying with physiochemical processes in real batteries. In the sub-circuit of an interface, these additional elements can, in this non-restrictive example, comprise additional resistances due to passivating films. In the active particles, electron conductive material and electrolyte as well as in the interconnect these additional elements comprise elements, which enable higher fidelity of representation of Poison-Nernst-Planck equation, which describes transport phenomena in continuous media, with electric components.

In certain battery types, e.g. batteries with solid electrolytes, a specific separator is not needed, since electrolyte, e.g. ionic conductor, already acts also as a separator. Due to this fact and due to the fact that porous separator is, in general, filled with the electrolyte to ensure ion conductivity notation interconnect will be used for the sub-circuit that enables ion transport between electrodes. Therefore, this sub-circuit features on the level of the sub-circuit representation equality to the electrolyte sub-circuit, which will be introduced later in the document. The term interconnect can therefore refer to a sub-circuit model which provides the functionality of the electrolyte, for example an electrolyte which enables ion transport, and the functionality of a separator, for example a separator which hinders the transport of electrons. In some presented embodiments, hindering the transport of electrons can be ensured by omitting direct intra-battery cell electron connections, which is not present in the electrolyte sub-circuit, between the cathode and the anode, except a direct connection via an external load. In some presented embodiments, this non-restrictive case will be presented. Some batteries, feature non-negligible self-discharge rates. Some embodiments can also cover this case by introducing direct intra-battery cell electron connections between the cathode and the anode.

The model topology presented in FIG. 19 can be capable of modelling batteries with electrodes including active particles with insertion reactions, blocking electrode, and electrode with faradaic reactions. In further embodiments of the invention specific derivations will be, in a non-restrictive manner, provided for active particles with insertion reactions.

In certain battery types, e.g. batteries with metal electrodes as of example Li-metal electrodes, electron conductive material is also the active electrode material. The concept proposed in FIG. 19 is sufficiently generic to model this case, as properties of the electron conductive material are calculated using material properties of the active electrode material and potential additional materials associated in the electron transport. To preserve generality of some proposed embodiments, notation electron conductive material will be used in both cases, in a case where active material conducts electrons or in a case where one or more materials are incorporated in the electrodes to enable or facilitate electron transport.

Each electrode can be modelled with one or more active particles. At least one or more of the sub-circuit models representing the interface can be associated with half redox reaction according at the anode and cathode. In this regard, the capacitance of a sub-circuit model representing the interface preferably relates to a double layer capacitance caused by the interface between solid electrode material and electron conductive material and electrolyte in a real battery. Furthermore, the resistor, which is arranged in series to at least one voltage source, can replicate an over-potential which might be due to surface reactions in the anode or cathode, respectively. The topology as defined within a sub-circuit model can therefore in particular comply with governing potential equations at an interface between electrolyte and bulk active material and allow a modelling and/or simulation of a real battery down to the level of half-redox reactions occurring in the anode and cathode, respectively.

In a real battery, the anode and cathode can be composed of an active material, an electron conductive material, an interface between the active material, electron conductive material and electrolyte and the electrolyte for each of the anode and cathode. In some batteries, a separator can further separate both electrodes (cathode and anode). Therefore, to obtain a more precise model of a battery, the electric circuit model can include at least one of the following: a model of an active material, a model of an interface between the active material, electron conductive material and electrolyte, a model of an electrolyte, and a model of interconnect. The model of the interconnect can model ion transport between the cathode and the anode.

Furthermore, the electric circuit model can include a load and/or a model of a current collector between the cathode and the load and a model of a current collector between the anode and the load. A closed electric circuit can be modelled and simulated by incorporating a load model. The performance of a battery under load can thus be evaluated.

In some embodiments, the sub-circuit model is associated with the interface between one active particle in the anode or cathode, electron conductive material and electrolyte. The at least one voltage source can provide an electric potential which corresponds to a half-redox reaction on the surface of the active particle. The one or more resistors can replicate an electric over-potential due to surface reactions at an interface between the active particle, electron conductive material and an electrolyte.

The capacitance might replicate a layer capacitance, in particular a double layer capacitance, of the active particle and electron conductive material against electrolyte.

At least one and preferably each of the one or more resistors can be a variable resistor. Due to the fact that they can take account of material diffusion coefficient changes with temperature and concentration. A more realistic model can therefore be implemented. However, the resistors can also have a non-variable value.

In some embodiments, the first current path includes a model of an active particle sub-circuit, the model of the active particle sub-circuit having a third current inlet and a fourth current inlet which are arranged in series in the first current path, and the model of the active particle sub-circuit includes at least a capacitance arranged between the third and fourth current inlet.

In some embodiments, the model of the active particle sub-circuit includes a plurality of capacitances arranged in parallel between the third and fourth current inlet, wherein two neighbouring parallel capacitances are connected with each other by two current paths running in parallel with each other, and wherein at least one of the two current paths comprises a resistor, in particular a non-variable or a variable resistor.

The equivalent electric circuit model might include a model of an electrolyte for the cathode which interconnects the first current inlets of the one or more sub-circuit models of the cathode with a model of an interconnect. The equivalent electric circuit model can include a model of an electrolyte for the anode which interconnects the first current inlets of the one or more sub-circuit models of the anode with the model of the interconnect. The model of the electrolyte for the anode might correspond to the model of the electrolyte for the cathode.

The model of the electrolyte can comprise a ninth inlet for connecting the interconnect and a plurality of inlets for connecting sub-circuit models, wherein each inlet of the plurality of inlets is connected with a first current inlet of a sub-circuit model.

A first conduction path with a resistor can be arranged between neighbouring inlets for sub-circuit models, and a second conduction path including a resistor and at least one conductance is arranged in parallel to the first conduction path between the neighbouring inlets for the sub-circuit models.

In some embodiments, at least one resistor is arranged in series between the inlets for the sub-circuit model and the ninth inlet in the model of the electrolyte.

In some embodiments, the model of the electrolyte includes at least first conduction path and a second conduction path in parallel to the first conduction path, wherein the first conduction path includes a set of resistors arranged in a series, wherein the second conduction path includes a set of resistors arranged in a series, wherein a current path exists between the first and second conduction paths after each resistor of the first conduction path and each resistor of the second conduction path, wherein each current path includes a capacitance.

In some embodiments, in between two neighbouring resistors of the first current path an inlet for one sub-circuit model is provided.

In some embodiments, the ninth inlet for connecting the interconnect can be provided at a predefined point at which the first conduction path and the second conduction path merge.

The equivalent electric circuit model might include a model of a interconnect, which is configured to model ion transport between the anode and the cathode.

In some embodiments, the model of the interconnect can comprise at least one fifth current inlet and at least one sixth current inlet, which are arranged between the first current inlet of the one or more sub-circuit models of the model of the cathode and the first current inlet of the one or more sub-circuit models of the model of the anode.

In some embodiments, the at least one fifth and at least one sixth current inlets of the interconnect model are arranged between a ninth inlet of a model of an electrolyte of the cathode and a ninth inlet of a model of an electrolyte of the anode.

In some embodiments, at least a resistor is arranged in series between the fifth current inlet and a sixth current inlet of the model of the interconnect.

In some embodiments, the model of the interconnect includes two parallel conduction lines, one conduction line including a set of first resistors arranged in a series, and the other conduction line includes a set of second resistors arranged in a series, wherein the two parallel conduction lines are arranged between the fifth current inlet and the sixth current inlet, and wherein a conduction path extends after each resistor of the set of first resistors and each resistor of the set of second resistors between the two conduction lines, and wherein each conduction path includes a capacitance.

The equivalent electric circuit model includes one or more models of an electric current collector, wherein an electric current collector, in particular an electric current collector on the cathode side, comprises two current inlets with one of the current inlets being connected to the second current inlet of the sub-circuit of the cathode, and/or wherein an electric current collector, in particular an electric current collector on the anode side, comprises two current inlets with one of the current inlets being connected to the second current inlet of the sub-circuit of the anode.

Each current collector comprises at least one resistor that can be arranged between the two inlets of the current collector. Alternatively, each current collector can comprise a resistor and an inductance, which is arranged in series to the resistor, wherein the resistor and capacitance are arranged between the two inlets of the current collector.

In some embodiments, at least one resistor is arranged between the electric current collector, in particular the electric current collector on the cathode side, and the second current inlet of the sub-circuit of the cathode. In some embodiments, at least one resistor is arranged between the electric current collector, in particular an electric current collector on the anode side, and the second current inlet of the sub-circuit of the anode.

In some embodiments, if more than one sub-circuit model is provided for the cathode or anode, respectively, the sub-circuit models of the respective cathode or anode are arranged in series and/or in parallel with each other.

In some embodiments, the equivalent electric circuit model includes a model of an electric load having a seventh current inlet and an eighth current inlet, which interconnect the second current inlet of the one or more sub-circuit models of the cathode and the second current inlet of the one or more sub-circuit models of the anode.

Preferably, an electric current collector on the cathode side comprises two current inlets with one of the current inlets being connected to, in particular via at least one resistor, the second current inlets of the one or more sub-circuits of the cathode, and with the other current inlet being connected to the seventh current inlet of the electric load.

Preferably, an electric current collector on the anode side comprises two current inlets with one of the current inlets being connected to, in particular via at least one resistor, the second current inlets of the one or more sub-circuits of the anode, and with the other current inlet being connected to the eighth current inlet of the electric load.

In some embodiments, the model of the electric load can include at least one sink or source configured to discharge or charge the battery respectively, wherein, preferably, the sink or source is arranged in series between the seventh current inlet and the eighth current inlet.

In some embodiments, the equivalent circuit model comprises a plurality of electric circuit element models that form a model of a closed battery circuit with a load, and the method further comprises that each electric circuit element of the plurality of electric circuit elements, in particular each of the at least one voltage source, the one or more resistors and the capacitance of the at least one sub-circuit model, is associated with at least one numerical equation to map the respective electric circuit element to at least one parameter of the battery.

In some embodiments, the method includes using the equivalent electric circuit model, the set of numerical equations and the numerical equations associated with the electric circuit elements of the plurality of electric circuit elements to simulate the battery.

At least some embodiments of the present invention relate to a method for simulation of batteries based on equivalent circuit models that are derived in such a way that they preserve consistently to physiochemical processes in real batteries thereby ensuring their consistency with electrochemical models, presented in FIG. 19. Due to its consistency to physiochemical processes in real batteries, elements of the equivalent circuit model and its sub-models, which virtually represents a battery, replicate specific processes in batteries, and due to its consistency with electrochemical models, element of such an equivalent circuit can be analytically derived (in addition to model parameter identification based on the experimental data) from parameters that are related to material and topological as well as geometrical characteristics of the battery cells.

This simulation method is applicable for direct current (DC) and alternating current (AC) stimuli. Due to its consistency with physiochemical processes in real batteries and its applicability to DC and AC current stimuli, the proposed method is applicable for executing the following tasks: 1.) simulating battery performance under DC and AC currents, 2.) estimating internal battery states, 3.) simulating battery degradation, and 4.) parameter identification. Due to these features it can be used in the following application areas: 1.) in the development and design studies of battery based systems, 2.) in interpreting experimental data by estimating parameters of the battery model for measured AC and/or DC signals, 3.) in analyses of battery degradation by either simulating degradation effects or by estimating parameters of the battery model for measured signals of degraded cells, 4.) as virtual twins, and 5.) as battery models in virtual observers. In the context of this invention observer covers State-of-Charge (SoC), State-of-Health (SoH), State-of-Energy (SoE), State-of-Power (SoP) and State-of-Safety (SoS) observers commonly abbreviated as SoX observers. These partly intertwined observes can be further combined into the State-of-Function (SoF) observer. One of the envisaged uses of the disclosed method for simulation of batteries based on equivalent circuit models is thus in the Battery Management Systems (BMSs).

The invention also relates to a data processing apparatus comprising means for carrying out the steps of the method in accordance with the present invention.

The invention also relates to a data processing apparatus comprising means for automated carrying out the steps of the method in accordance with the present invention that also enable software and hardware emulation of battery behavior.

The invention also relates to a data processing apparatus comprising means for automated carrying out the steps of the method in accordance with the present invention which include an appropriate hardware interface for enabling software and hardware emulation of battery behavior.

The invention also relates to a data processing apparatus with a dedicated hardware interface comprising means for automated carrying out the steps of the method of in accordance with the present invention that also enable software and hardware emulation of battery behavior.

The invention also relates to a computer program product comprising instructions which, when the program is executed by a computer, cause the computer to carry out the steps of the method in accordance with the present invention.

The invention also relates to a computer program product comprising instructions which, when the program is executed by a data processing apparatus with a dedicated hardware interface, causes the data processing apparatus to carry out the automated steps of the method in accordance with the present invention.

A computer-readable storage medium comprising instructions which, when executed by a data processing apparatus with a dedicated hardware interface, cause the data processing apparatus to carry out the automated steps of the method in accordance with the present invention.

The invention further relates to automation of the method with a computer-readable storage medium comprising instructions which, when executed by a computer, cause the computer to carry out the steps of the method in accordance with the present invention.

The invention also relates to a data carrier signal carrying the computer program product in accordance with the present invention.

Although, an accurate estimation of listed properties requires more than the knowledge of cell voltage and temperature, current BMSs on the market mainly relay on voltage measurement (mostly cell level), current measurement (mostly pack level) and temperature measurement at one or several locations in pack. However, it is well known that cell history has an important influence on current battery voltage, which is clearly discernible from the well know voltage relaxation after pulses, while specific electrode materials feature even more intriguing phenomena as for example the memory effect characteristic for phase separating materials (Sasaki, et al., Nature Materials, 12.6: 569-575, 2013; Kondo, et al., Journal of The Electrochemical Society, 165.10: A2047,2018; Zelid, et al., Journal of Mechanical Engineering, 65, 2019). These materials clearly indicate that a sophisticated model that can be used in previously listed application areas should enable modelling states that yields information on battery history.

In addition, most models applied in BMSs use simple model topologies, which do not virtually replicate specific processes in batteries, and look-up tables (Jaguemont, et al., IEEE Transactions on Energy Conversion, 32.4: 1447-1455, 2017) or simple algebraic expressions (Zhang, et al., International Journal of Electrical and Computer Engineering, 11.3: 277-282, 2017) to estimate SOC on the basis of a measured voltage and potentially also temperature. Such models are characterized by low computational expenses and high computational speed. However, this type of models is capable to virtually replicate battery performance only under the specific conditions under which they were parametrised. Therefore, these models feature limited applicability when applied outside parametrized voltage or capacity range, at extreme ambient conditions and in particular for degraded cells. Theoretically, it would be possible to generate parametrisation cases for a very wide range of voltage or capacity and temperature ranges at the expense of unreasonably high cost and effort of parametrisation. However, as different cells feature different long term histories, which provoke different degradation phenomena, it is not possible to a-priori investigate the design space that would allow for efficient parametrisation over the entire lifetime of the battery. These challenges might be approached by introduction of models featuring multiple modelling structures, i.e. topologies, in different SoC regions or for aged cells. But, such models impose even bigger challenges in terms of stability and convergence of observers, as both model structure and model parameters need to be adapted. Challenges might also be approached by introduction of more sophisticated methods, as for example Kalman filters or machine learning methods that are also applied for SoC estimation with an aim of reducing addressed problems.

Listed problem further aggravate when more complex observes as for example SoH and even more for SoS observers are concerned. Currently large variety of techniques, e.g. aforementioned Kalman filters, machine learning methods . . . , are applied for such type of observes with limited success, in particular, in off design operating conditions and for degraded cells. These methods again feature shortcomings, which arise from the absence of consistency to the physiochemical processes in real batteries. Therefore, variations of determined model parameters or variation in any other type of model output, in general, cannot be correlated with specific battery health and associated battery safety relevant processes with sufficiently high certainty.

With the aim to preserve high level of consistency to the physiochemical processes in real batteries WO2016151336A1 disclose a method of equivalent circuit networks (ECNs), where elements of these circuits are not based on any underlying principle of the battery's operation but are designed iteratively, based on outcomes. The proposed methodology introduces the so called triple species element—TSE, which links the two domains together. This way information from the electrode potential and species flux rate just inside the electrode active particle is linked to the electrolyte potential and species flux rate just outside the particle. This interface element was implemented in the model to introduce to the model non-linear effects and other effects which, according to the statement in WO2016151336A1, cannot find ready electrical analogues for handling via the ECNs themselves. One of the deficiencies of this approach arises from the fact that TSE is not an element that could easily be implemented in electrical circuits. One of the important aspects of this invention, therefore, arises from the fact that it discloses that electrical analogues, which resolve non-linear effects including non-linear effects at the surface, can be elaborated.

WO2020129477A1, JP2017501374A and JP2015527566A disclose a method for battery state estimation device, a battery state estimation method, and a battery system that estimate a state of a battery cell such as a lithium ion battery. More specifically, it discloses a method for modelling a secondary battery with an equivalent circuit of OCV, a negative electrode, a positive electrode, and diffusion, estimating polarization (diffusion) characteristics, and estimating OCV. Despite indication that current measured by the current measuring unit, and a control unit that estimates an OCV (Open Circuit Voltage) of the battery cell based on an equivalent circuit model is based on the electrochemistry of the battery cell, the model does not feature very high consistency to the physiochemical processes in real batteries. This not very high consistency to the physiochemical processes in real batteries is discernible mainly through non appropriate positioning of the double layer capacitance that should be connected in parallel to the half redox reaction at each of the electrodes or electrode specific OCV as denoted in the WO2020129477A1, and due to the fact that at least one conductor that comprises only resistors and voltage sources exist in the model, which means that, in general, there is not a finite capacity in the battery. One of the important aspects of this invention, therefore, arises from the fact that it discloses method for simulation of batteries based on equivalent circuit models, which adequately positions elements to reflect double layer capacitance and yield limited capacity of the battery.

Another inconsistency to the physiochemical processes in real batteries that is commonly applied in the equivalent circuits models arises from an important aspect that models should include at least one resistor which is connected to voltage source in series. This resistor or multiple resistors are namely required to properly virtually replicate overpotential due to surface reactions. Such model topology is thus required to adequately model charge-discharge hysteresis.

The details of one or more embodiments of the subject-matter described herein are set forth in the accompanying drawings and the description below. Other feature, objects, and advantages of the subject-matter will be apparent from the description and drawings, and from the claims.

FIG. 2 shows a table which lists the nomenclature of the quantities used in equations (1)-(11).

Labels A and B in circles will serve at the description of the whole electrode equivalent circuit assembly.

Figure 8:
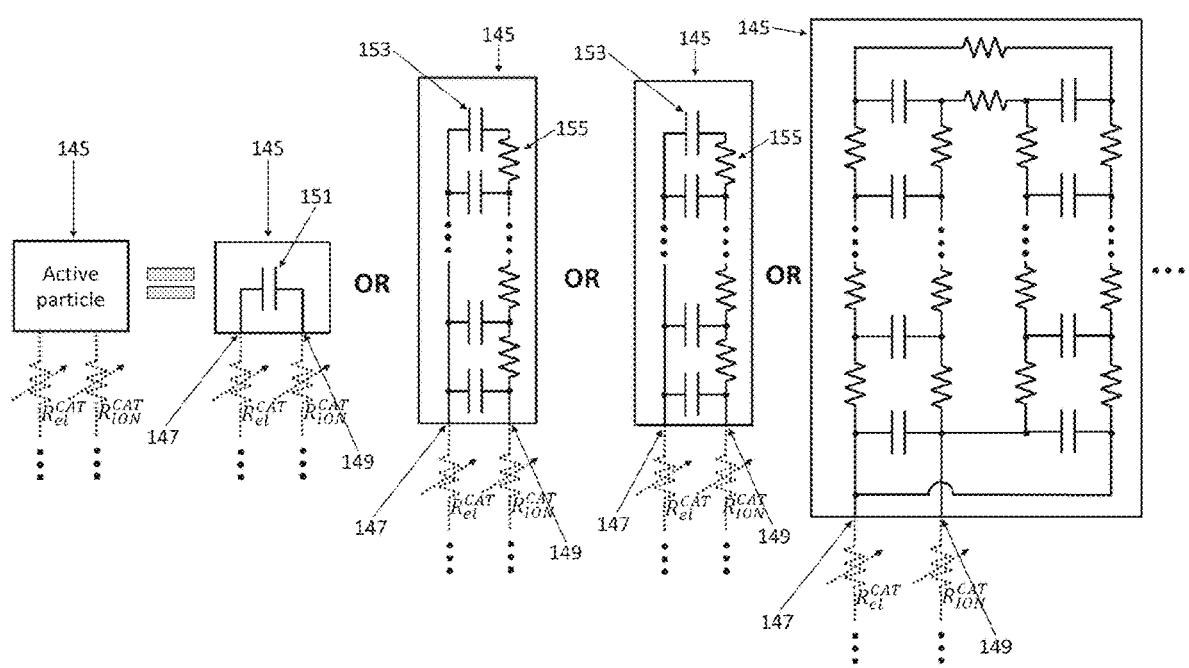

FIG. 8 shows schematically different possibilities for the description of active particles in an electric circuit model of a battery using electric circuit elements.

Figure 9:
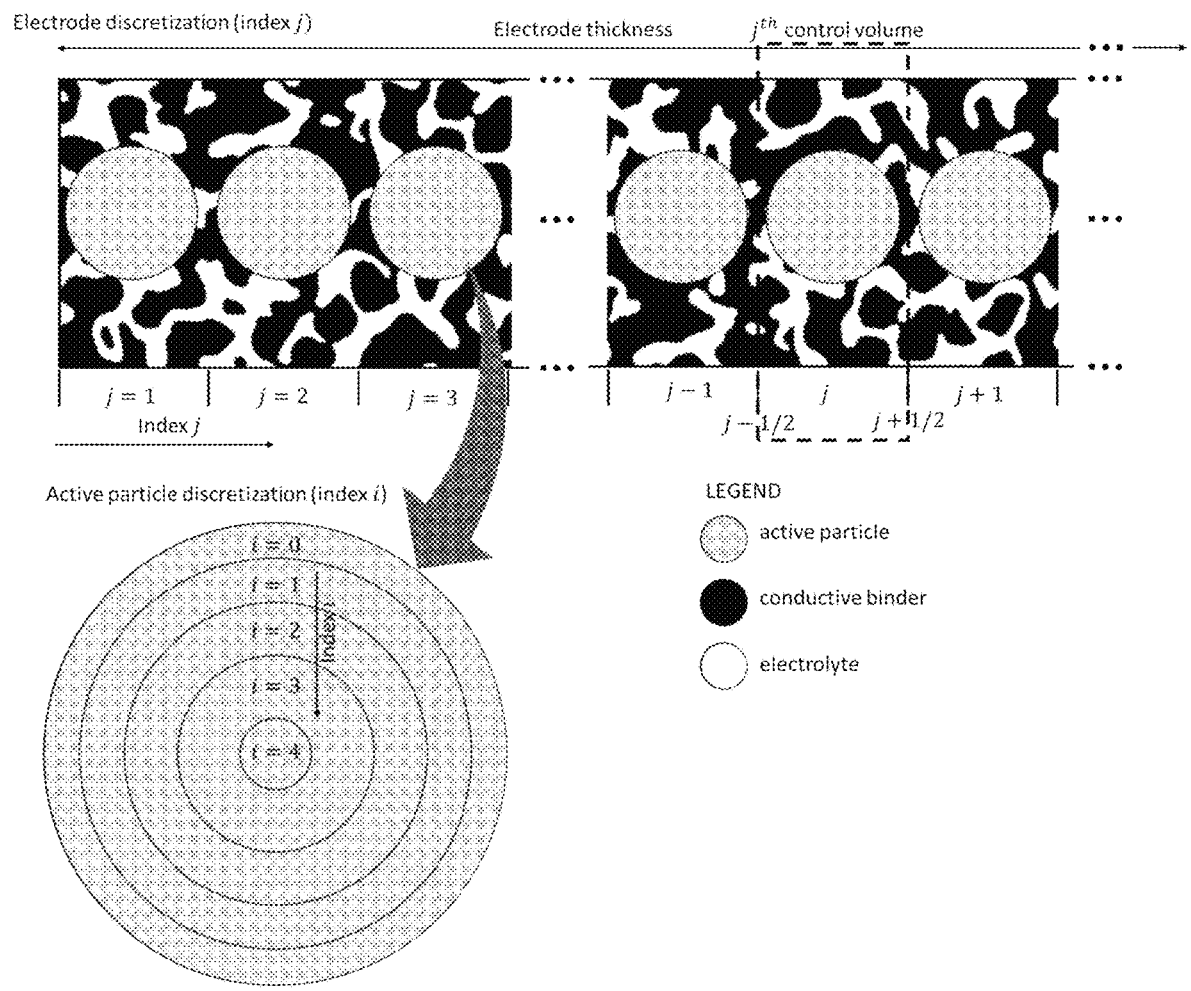

FIG. 9 shows schematically a representation of the meaning of indexes i and j. The upper image shows the scheme of whole electrode. Black parts represent porous conductive binder, with the electrolyte trapped inside the pores (white color). Gray spheres represent active electrode particles that are simultaneously attached to electron conductive material as well as electrolyte. Discretization of electrode along the electrode thickness direction is indexed by index j. Bottom left graphics shows zoom in of one of the active particles and its inner discretization. Active particle inner discretization is indexed by index i.

Figure 10:
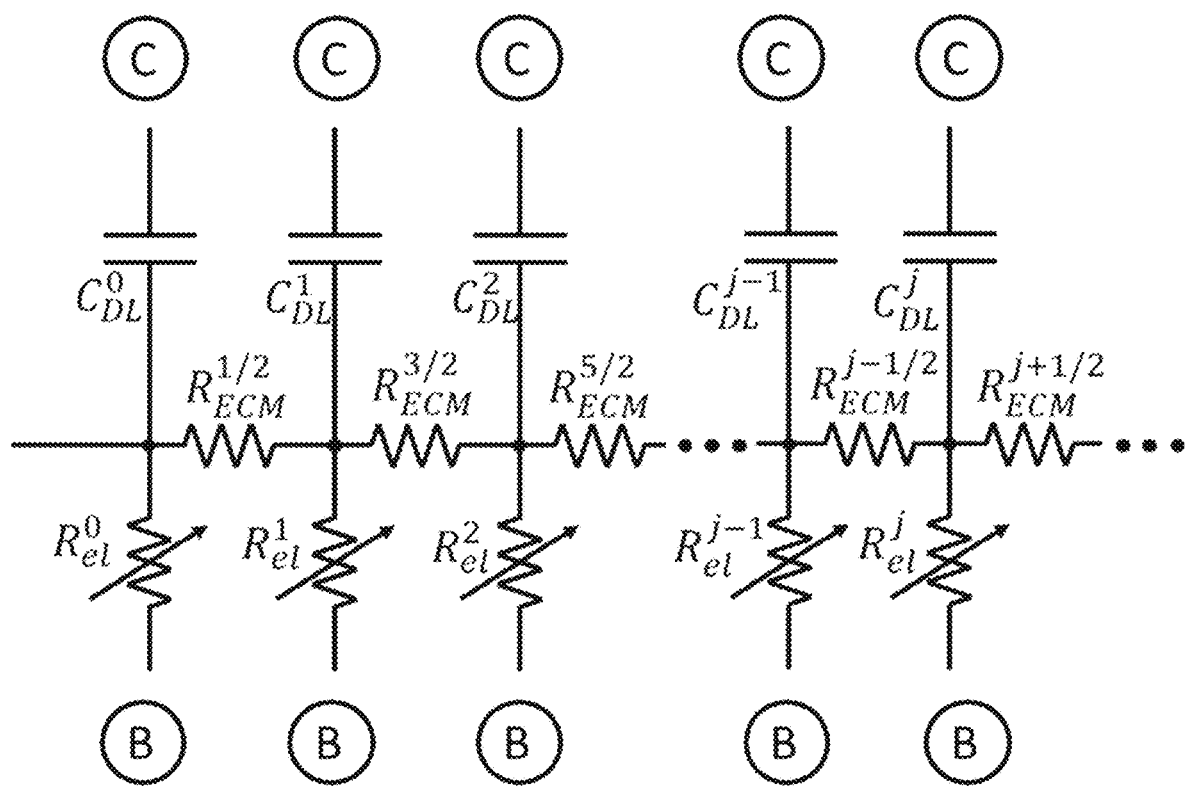

FIG. 10 shows schematically a transmission line representing electron conductive material inside porous electrode for use in an electric circuit model of a battery.

Figure 11:
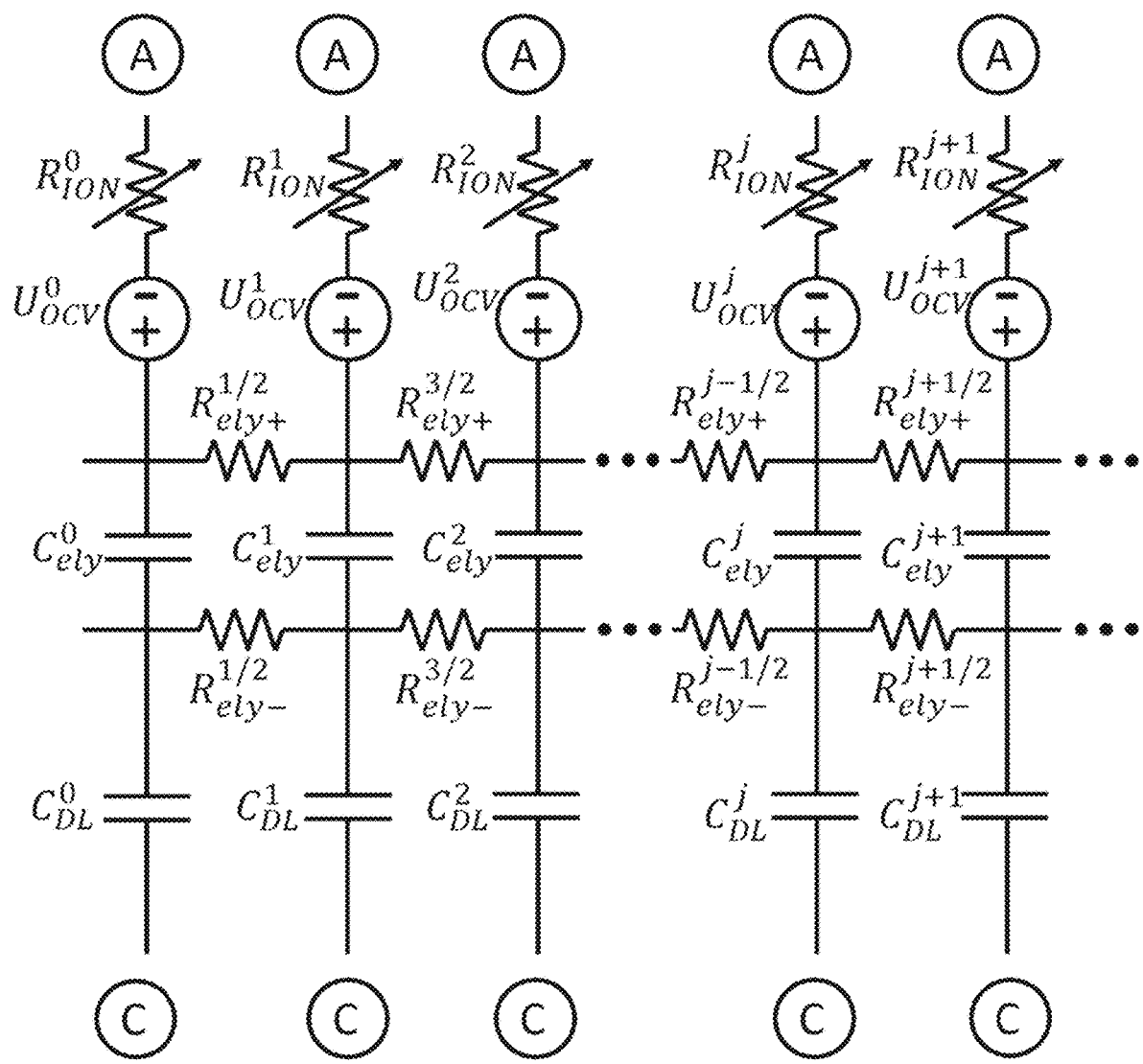

FIG. 11 shows schematically equivalent circuit representation of a model of an electrolyte for use in an electric circuit model of a battery.

Figure 12:
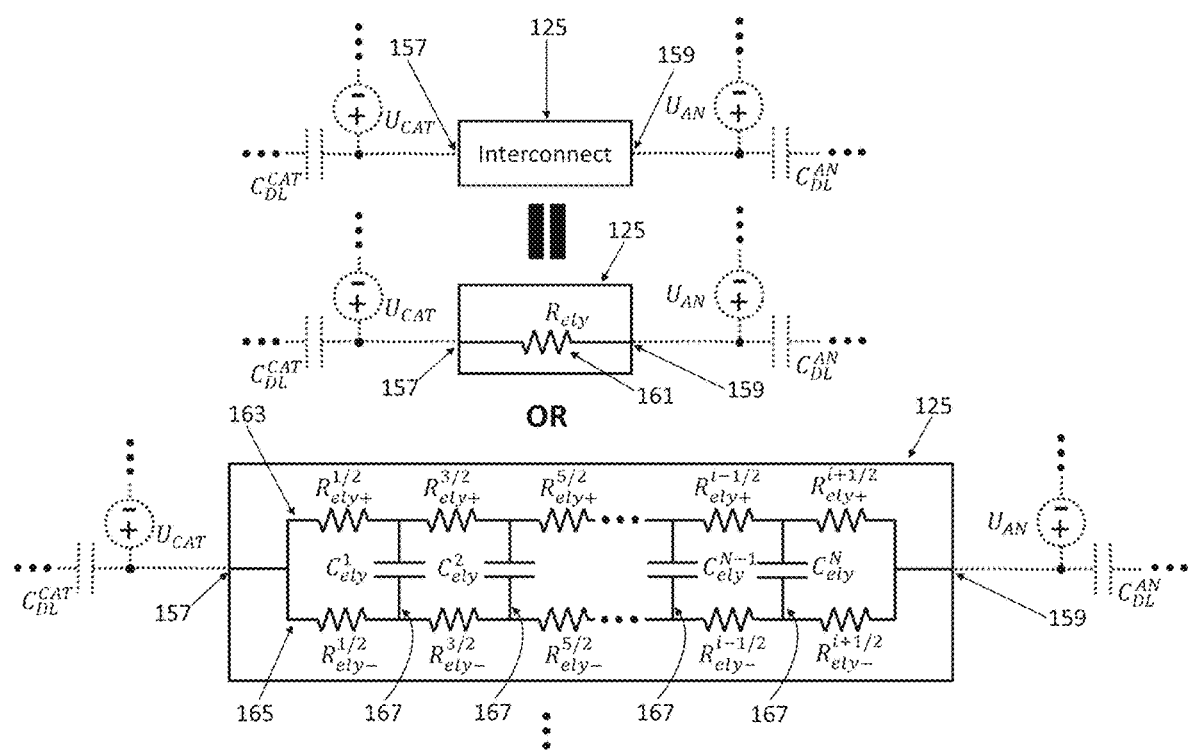

FIG. 12 shows schematically different possibilities for the implementation of an interconnect model, which features the same topology as the model of an electrolyte.

Figure 13:
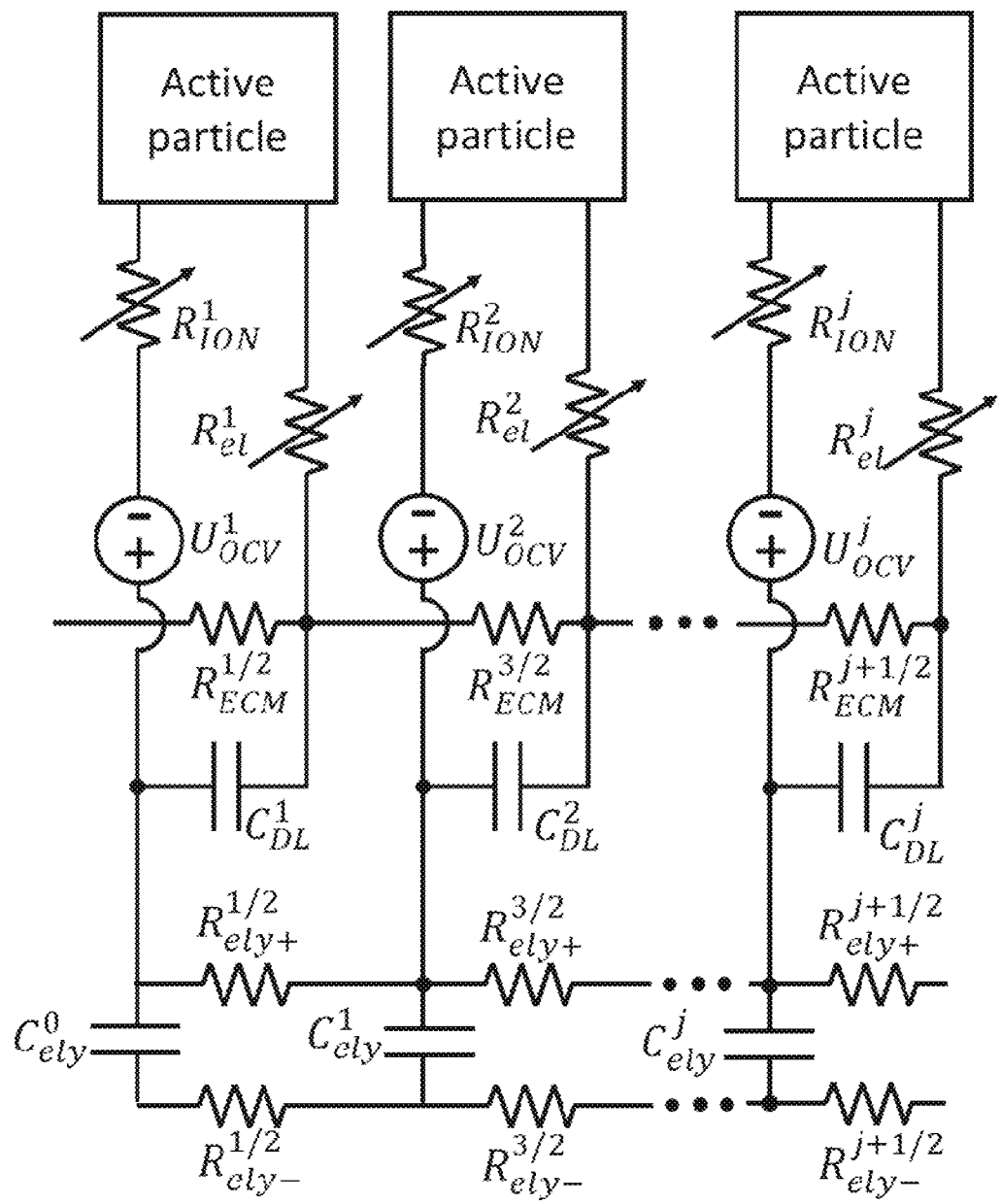

FIG. 13 shows schematically an exemplary model of an electric circuit of a battery, designed by consistent mapping of circuit topology to the porous electrode equations.

Figure 14:
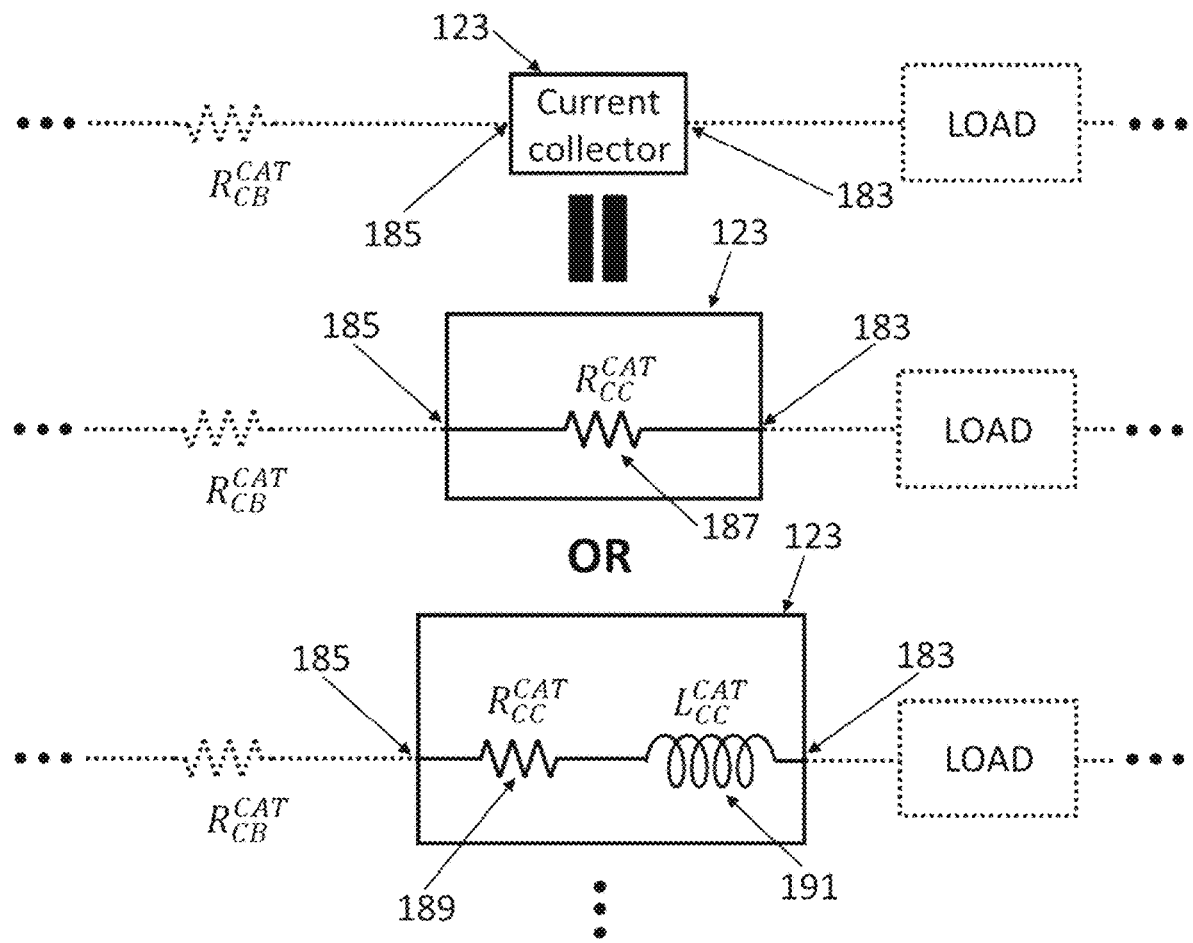

FIG. 14 shows schematically different possibilities for the implementation of a current collector model.

Figure 15:
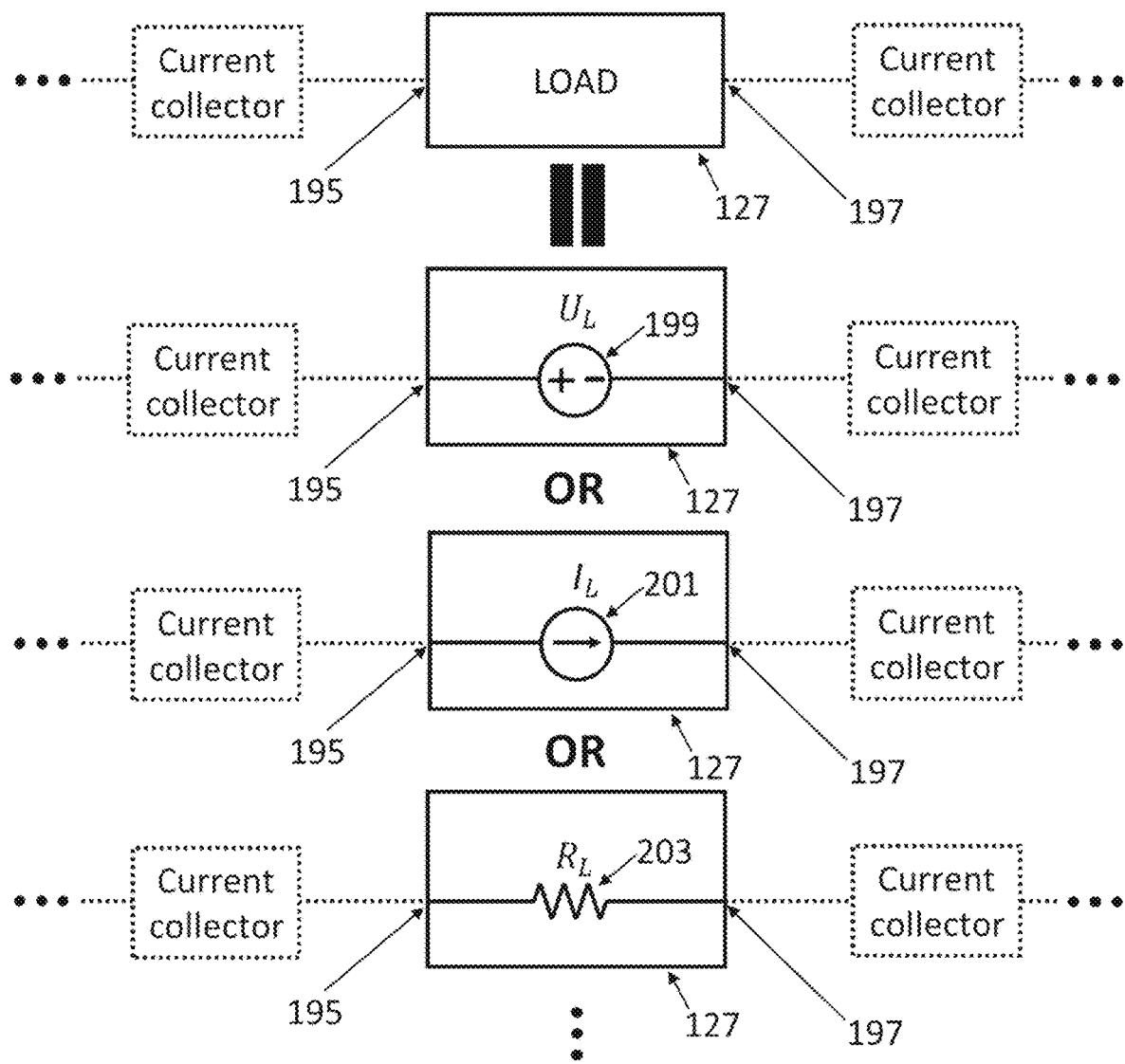

FIG. 15 shows schematically different possibilities for the implementation of a load model.

Figure 16:
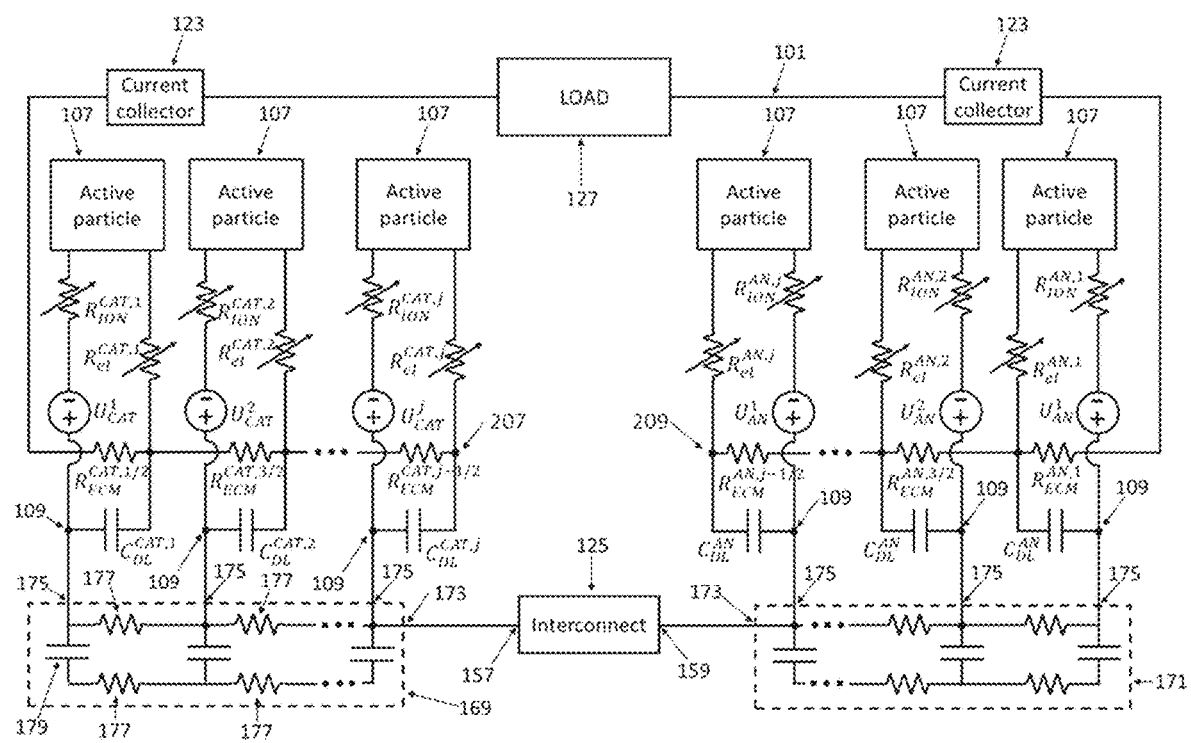

FIG. 16 shows schematically an example of a full battery model with many active particles in each electrode.

Figure 17:
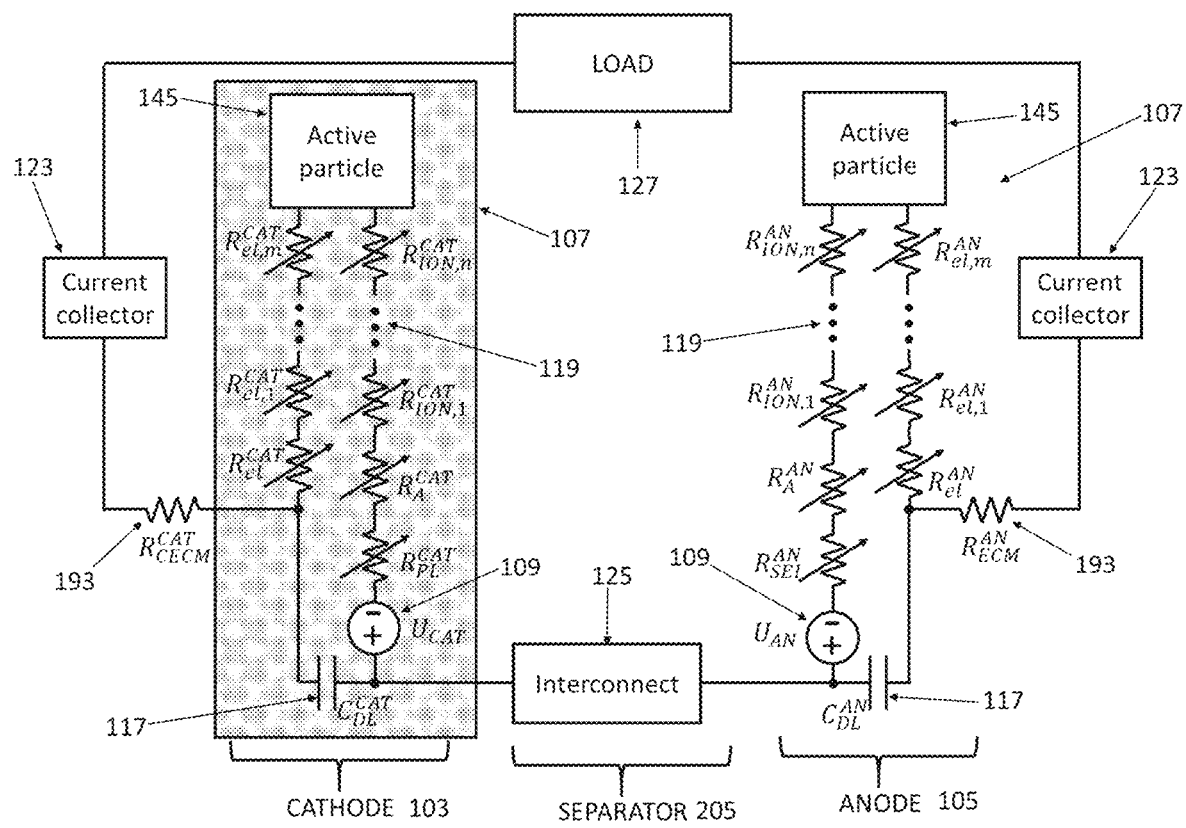

FIG. 17 shows schematically an example of a battery model with one particle in anode and one in cathode and complex description of active particle surface by several different terms in series.

Figure 18:
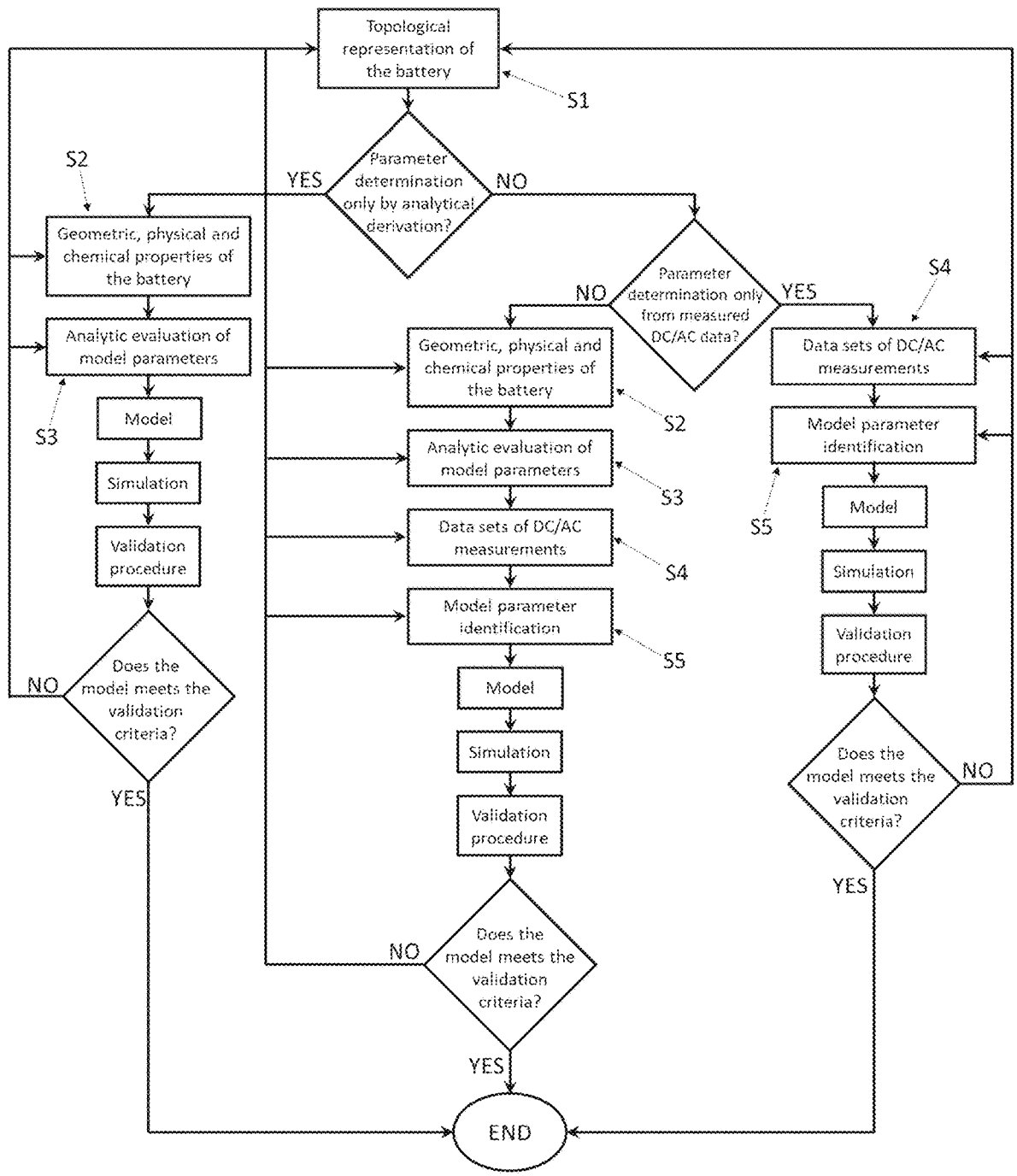

FIG. 18 shows schematically an example of a process diagram.

Figure 19:
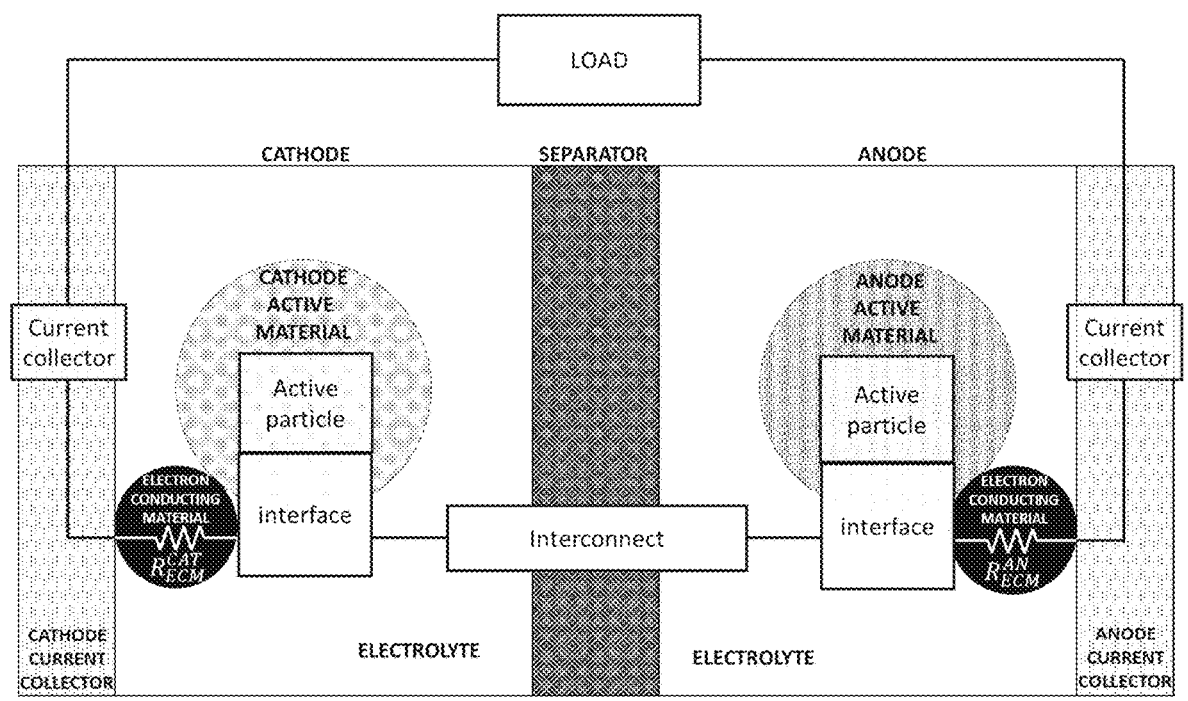

FIG. 19 shows schematically mapping between real topological representation of the battery and topology of the equivalent circuit model.

At least some embodiments of the present invention relate to a data processing system and a corresponding method for modelling and/or simulating and/or emulating a battery. In a data processing system, a processor is configured to provide an equivalent electric circuit model of the battery. An exemplary electric circuit model is shown in FIG. 1, and the electric circuit model includes a plurality of sub-circuit models comprising electric circuit elements (in modelled form) which are arranged to form the electric circuit model 101.

The equivalent electric circuit model 101 includes a model of a cathode 103 and a model of an anode 105. More specifically, a set of circuit elements of the model electric circuit 101 is arranged to form the model of the cathode 103, and a further set of circuit elements of the model electric circuit 101 is arranged to form the model of the anode 105.

Figure 1:
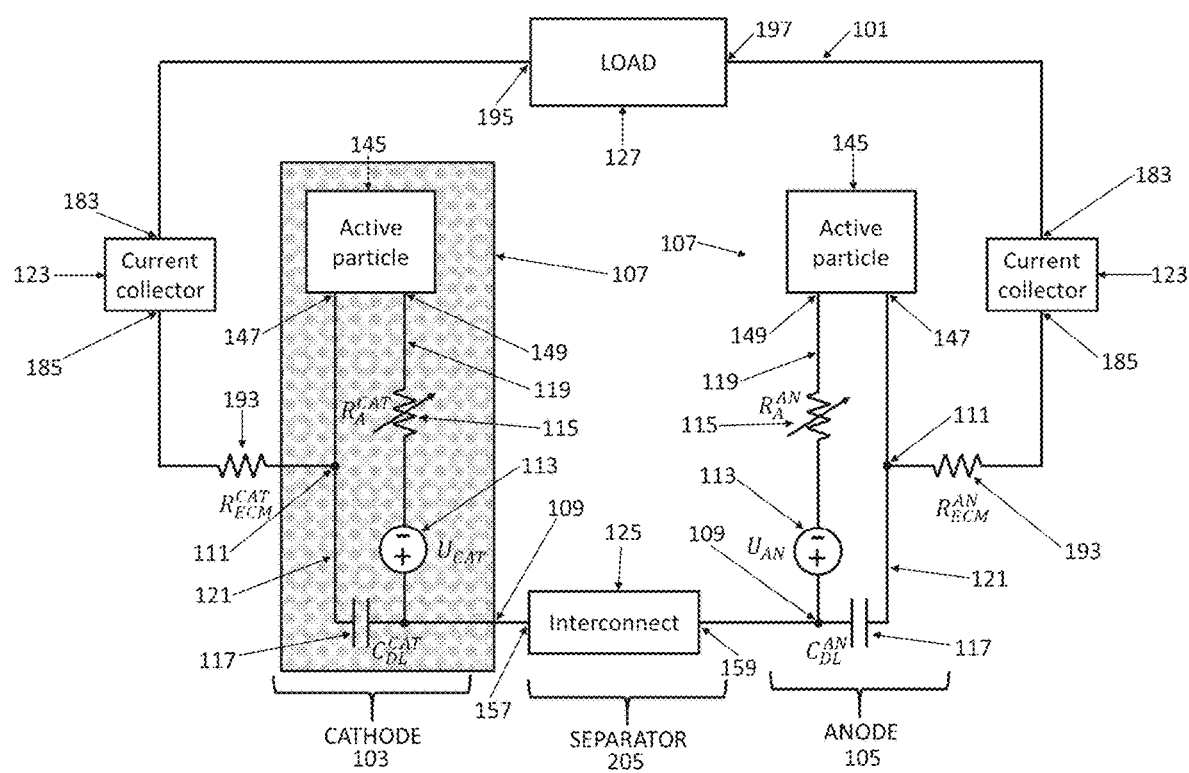
FIG. 1 shows schematically an example of an electric circuit model of a battery.

As further shown in FIG. 1, the sets of the models of the plurality of electric circuit elements of the cathode model 103 and the anode model 105 form a sub-circuit model 107. The sub-circuit model 107 comprises a first current inlet 109, a second current inlet 111, at least one voltage source 113, one or more resistors 115, and a capacitance 117. A first current path 119 is arranged between the first current inlet 109 and the second current inlet 111. The at least one voltage source 113 and the one or more resistors 115 are arranged in series in the first current path 119. A second current path 121 is arranged in parallel to the first current path 119 between the first current inlet 109 and the second current inlet 111, and the capacitance 117 is arranged in the second current path 121. The capacitance is therefore arranged in parallel to the one or more resistors 115 and the at least on voltage source 113.

The model electric circuit 101 can include in addition to the cathode model 103 and the anode model 105 one or more models of a current collector 123, a model of a interconnect 125, and a model of a load 127. The interconnect 125 is included in the separator 205. These components will be described later in more detail. The model electric circuit 101 forms a model of a battery and can be employed in a numerical simulation to calculate properties and/or parameters of the battery.

The term "inlet" as used for example for first current inlet 109 or second current inlet 111 is not limiting a direction of flow of electric current. Thus, electric current can flow in either direction along the electric circuit through the respective current inlet.

As further shown in FIG. 1, a sub-circuit model 107 can include a model of an active particle sub-circuit 145 (also called active particle model or model of active particle), which is arranged in the first current path 119. The model of the active particle sub-circuit 145 has a third current inlet 147 and a fourth current inlet 149 which are arranged in series in the first current path 119.

FIG. 8 shows schematically several exemplary implementations. As shown, in some embodiments, the model of the active particle sub-circuit 145 includes a capacitance 151 arranged between the third and fourth current inlet 147, 149.

Alternatively, the model of the active particle sub-circuit 145 can include a plurality of capacitances 153 arranged in parallel between the third and fourth current inlet. Two neighboring parallel capacitances 153 can be connected with each other by two current paths running in parallel with each other. At least one of the two current paths comprises a resistor 155, which can be a fixed or variable resistor. Alternatively, configurations that are more complex are possible as shown on the right side of FIG. 8, which shows a transmission line equivalent circuit.

The interconnect model 125 as shown in the model electric circuit 101 of FIG. 1 is include in the separator 205. Interconnect model 125 relates to transport of ions, which is a separator functionality, whereas another separator functionality, which is related to hindering electron transport via electrolyte or an electron insulating electrolyte, is ensured by omitting direct intra-battery cell electron connections. The model of the interconnect 125 comprises a fifth current inlet 157 and a sixth current inlet 159, which are arranged between the first current inlet 109 of the sub-circuit model 107 of the model of the cathode 103 and the first current inlet 109 of the sub-circuit model 107 of the model of the anode 105.

FIG. 12 shows various exemplary implementations of an electrolyte and interconnect model in more detail. The same implementations can also be made for the electrolyte model. As shown, the interconnect model 125 can in one example include a resistor 161 which is arranged in series between the fifth current inlet 157 and the sixth current inlet 159.

In another example, shown in FIG. 12, the model of the interconnect 125 includes two parallel conduction lines. One conduction line 163 includes a set of first resistors (shown by the usual symbol, which is accompanied by an "R" in FIG. 12). The first resistors in conduction line 163 are arranged in a series. The other conduction line 165 includes a set of second resistors that are also arranged in a series. The two parallel conduction lines 163, 165 are arranged between the fifth current inlet 157 and the sixth current inlet 159. A conduction path 167 extends after each resistor of the set of first resistors and each resistor of the set of second resistors between the two conduction lines 153, 165. Each conduction path 167 includes a capacitance, which is shown by the usual symbol and accompanied by an "C" in FIG. 12. The corresponding circuit in FIG. 12 can also be regarded as a transmission line equivalent circuit.

An electrolyte model 169 can be arranged between the cathode and the interconnect 125 and a further electrolyte model 171 can be arranged between the anode 105 and the interconnect 125, which is not shown in FIG. 1, but in FIG. 16.

In the exemplary model electric circuit of FIG. 16, three sub-circuit models 107 are arranged on the cathode side as well as on the anode side, further in contrast to FIG. 1.

A model of the electrolyte 169 for the cathode interconnects the first current inlets 109 of the one or more sub-circuit models 107 of the cathode with the fifth current inlet 157 of the interconnect model 125. The model of the electrolyte 171 for the anode interconnects the first current inlets 109 of the one or more sub-circuit models 107 of the anode 105 with the sixth current inlet 159 of the interconnect model 125. As can be seen, the electrolyte models for the anode and cathode corresponds to each other. More specifically, the electrolyte model can comprise a ninth inlet 173 for connecting the interconnect model 125 and a plurality of inlets 175 for connecting the sub-circuit models 107.

As further shown in FIG. 16, in an electrolyte model 169, 171 a first conduction path with a resistor 177 is arranged between neighboring inlets 175 for the sub-circuit models, and a second conduction path including a resistor 177 and at least one capacitance 179 is arranged in parallel to the first conduction path between the neighboring inlets 175 for the sub-circuit models 106. FIG. 11 further illustrates an equivalent circuit representation of an electrolyte.

A sub-circuit model, for example including one resistor, could be arranged between points 207 and 209 to model self-discharge of batteries due to non-perfect electron insulation between the electrodes.

As further shown in FIG. 1, an electric current collector model 123 is employed on the cathode side and the anode side. The electric current collector model 123 on the cathode side comprises two current inlets 183, 185 with one of the current inlets 185 being connected to the second current inlet 111 of the sub-circuit model 107 of the cathode 103. The electric current collector 123 on the anode side comprises two current inlets 183, 185 with one of the current inlets 185 being connected to the second current inlet 111 of the sub-circuit model 107 of the anode 105.

Exemplary implementations of an electric current collector model 123 are shown in FIG. 14. As shown, in one example, an electric current collector model 123 can comprise at least one resistor 187 arranged between the two inlets 183, 185. In another example, a current collector model 123 comprises a resistor 189 and an inductance 191, which is arranged in parallel to the resistor 189 between the two inlets 183, 185 of the current collector model 123.

As further shown in FIG. 1, an additional resistor 193 can be arranged between the current collector model 123 and the cathode or anode 103, 105.

Several sub-circuit models in parallel (see FIG. 8):

As mentioned before and shown in FIG. 1, the equivalent electric circuit model 101 includes a model of an electric load 127 having a seventh current inlet 195 and an eighth current inlet 197, which interconnect the second current inlet 111 of the one or more sub-circuit models 107 of the cathode 103 and the second current inlet 111 of the one or more sub-circuit models 107 of the anode 105. More specifically, the electric current collector 123 on the cathode side comprises two current inlets with one of the current inlets 185 being connected to resistor 193 and further to the second current inlets 111 of the one or more sub-circuits 107 of the cathode 103, and with the other current inlet 123 being connected to the seventh current inlet 195 of the electric load model 127.

Moreover, the electric current collector 123 on the anode side comprises two current inlets with one of the current inlets 185 being connected to, in particular via resistor 193, the second current inlets 111 of the one or more sub-circuits 107 of the anode 103. The other current inlet 183 is connected to the eighth current inlet 197 of the electric load model 127.

Exemplary implementations of the load model 127 are shown in FIG. 15. The model of the electric load 127 includes at least one sink which is configured to discharge the battery. The load model 127 can alternatively include a source configured to charge the battery. The sink or source can for example be a voltage source 199, a current source 201, or a resistor 203. The sink is arranged in series between the seventh current inlet 195 and the eighth current inlet 197.

As illustrated by way of example, the equivalent circuit model 101 can comprise a plurality of electric circuit element models, such as the described models of a cathode 103, anode 105, interconnect 125, etc., that can form a model of a closed battery circuit with the load model 127. In some embodiments, the method can further comprise that each electric circuit element of the plurality of electric circuit elements, in particular each of the at least one voltage source 113, the one or more resistors 115 and the capacitance 121 of the at least one sub-circuit model 107, is associated with at least one numerical equation to map the respective electric circuit element to at least one parameter of the battery.

The disclosed subject matter addresses challenges of previous models known in the prior art, and aims for preserving consistency to physiochemical processes in real batteries or for being consistent with electrochemical models. This consistency arises from adequate mapping between real topological representation of the battery and topology of the equivalent circuit model (FIG. 19) and proper positioning and interactions of the sub-circuits as discernible from FIG. 19 and FIG. 1. This mapping determines basic sub-circuit models of the equivalent circuit model of the battery. The main sub-circuit models that constitute the equivalent circuit model can be: active material, electron conductive material and electrolyte as well as the interface between them in at least one electrode and interconnect between the electrodes as well as current collectors and the load. Specific sub-circuit models can inherently comprise process specific electrical components, which can be mandatory for credible virtual representation of physiochemical processes in real batteries.

The sub-circuit of an interface (represented by a sub-circuit model 107 in FIG. 1) virtually replicates phenomena at the interface between active material, electron conductive material and the electrolyte. Additional resistances due to, for example, passivating films (FIG. 17) might be added to these mandatory components to further refine fidelity of the sub-circuit models while simultaneously complying with physiochemical processes in real batteries.

Equivalent circuit representation of equations that describe active particles, electron conductive material and electrolyte as well as an interconnect, obtained from Poison-Nernst-Planck are well known and can be used as physio-chemically consistent embodiments of those domains. Topological representation of these sub-circuits can therefore, within physio-chemically consistent embodiments of those domains, vary to a certain extend considering the modelling depth requested by the user of determined by the optimisation algorithm that refines topology of sub-circuits.

Exemplarily, an interconnect sub-circuit can be modelled with different embodiments presented in FIG. 12, which for example influence transient response and in particular response to AC stimuli. Therefore, a user of optimisation algorithm can, within physio-chemically consistent embodiments of those domains, determine most suitable arrangement of sub-circuit within the equivalent circuit model topology and/or sub-circuit topology based on the intended applications, since more complex topologies on the other hand can require more computational effort.

Some embodiments, therefore, can comprises sub-circuit models of the equivalent circuit model of the battery, wherein sub-circuit models comprise elements, in particular circuit elements. Successful execution of the models requires knowledge of the model topology as well as on the values of parameters of constituting elements.

In some embodiments, values of resistance, capacitance, inductance and the voltage source elements of sub-circuits are determined by model parameter identification techniques applied to experiment data measured in time or frequency domain as presented in FIG. 18.

In some embodiments, values of resistance, capacitance, inductance and the voltage source elements of sub-circuits can be determined by analytical evaluation of model parameters (FIG. 18). In some embodiments a set of numerical equations is provided that numerically describe the electrically interplay of the plurality of electric circuit elements. The equations can for example be provided such that they are consistent with electrochemical models. For example, Poison-Nernst-Planck equation can be used to describe transport phenomena in continuous media, as they can be applied to the active particles, electron conductive material and electrolyte as well as to the interconnect. For example, a system of the equations that fully describe a porous electrode can be complemented with boundary conditions that interrelates the equations by description of physio-chemical properties of interfaces between domains.

In the following non-restrictive example, consistency with electrochemical models will be demonstrated on the classic porous electrode theory as postulated by Newman et al. in references (Newman & Tiedemann, AIChE Journal, 21.1: 25-41, 1975, Doyle, et al., Journal of Electrochemical Society, 140.6: 1526, 1993; Doyle & Newman, Journal of Power Sources, 54.1: 46-51, 1995), that consist of four partial differential equations. These four equations are derived from Poison-Nernst-Planck equation system (Lai & Ciucci, Electrochimica Acta, 56.11: 4369-4377, 2011) and represent two conservation laws for two different components (phases) of porous media (solid matrix and liquid inside pores). In context of a porous electrode, the solid part represents the composite of active electrode material and electron conductive material (e.g. carbon black) and liquid part is electrolyte. The electrolyte can be taken into consideration in the model of FIG. 1 by adding an electrolyte model between the first current inlet 109 and the interconnect 125 on the anode side as well as on the cathode side. This will be discussed later in the text in some more detail.

Porous Electrode Equation System Reads:

Mass Conservation in Active Material $$\frac{\partial c_s}{\partial t} = \nabla(D_s \nabla c_s) \tag{1}$$

Charge Conservation in Electron Conductive Material $$\nabla(\sigma^{eff} \nabla \phi_s) = -aFj^{TOT} \tag{2}$$

Mass Conservation in Electrolyte $$\frac{\partial \varepsilon c_{ely}}{\partial t} = \nabla\left(D_{ely}^{eff} \nabla c_{ely}\right) + a(1 - t_+)j^{TOT} \tag{3}$$

Charge Conservation in Electrolyte $$\nabla\left[\kappa_{ely}^{eff} \nabla \phi_{ely} - 2\frac{\kappa_{ely}^{eff} RT}{F}(1 - t_+)\left(1 + \frac{\partial \ln f_\pm}{\partial \ln c_{ely}}\right)\nabla \ln c_{ely}\right] = aFj^{TOT} \tag{4}$$

A system of the equations that fully describe porous electrode is complemented with boundary conditions that interrelate all four equations by description of physiochemical properties of interfaces between both domains (solid and liquid domain). Boundary conditions read:

$$j^{TOT} = j^{BV} + j^{DL} \quad (5)$$

$$\tilde{C}_{DL}\frac{\partial(\phi_S - \phi_{ely})}{\partial t} = \frac{j^{DL}}{Fa} \quad (6)$$

$$j^{BV} = \frac{j_0}{F}\left[\exp\left(-\frac{F\alpha}{RT}\eta\right) - \exp\left(\frac{F(1-\alpha)}{RT}\eta\right)\right] \quad (7)$$

$$\eta = -(\phi_S - \phi_{ely} - \tilde{U}_{OCV}) \quad (8)$$

$$\tilde{U}_{OCV} = U_{OCV} - \frac{\mu(c_s^0)}{F} \quad (9)$$

$$\nabla c_s |_{z=L_p/2} = 0 \quad (10)$$

$$-D_s \nabla c_s |_{z=0} = j^{TOT} \quad (11)$$

In Eq. (6) $\phi_S - \phi_{ely}$ can also be interpreted as double layer voltage drop $U_{DL}$ $$U_{DL} = \phi_{ely} - \phi_S \quad (12)$$

The table in FIG. 2 shows the nomenclature of all the quantities used in equations (1)-(11).

One of the main challenges in transforming electrochemical models into adequate equivalent circuit analogues, such as the model electric circuit of FIG. 1, arises from a model representation of electron, ion and neutral species transport, e.g. Li (Lithium) in the case of Li-ion based batteries, but also any other intercalating species in any other type of batteries, with the equivalent circuit model. A preferred solution comprises such a topology, 1.) where all three species are represented in a single circuit build of electrical elements, 2.) where all three species are subject to adequate governing forces and 3.) where circuit topology complies with governing potential equations at the interface between active material, electron conductive material and electrolyte.

Figure 3:
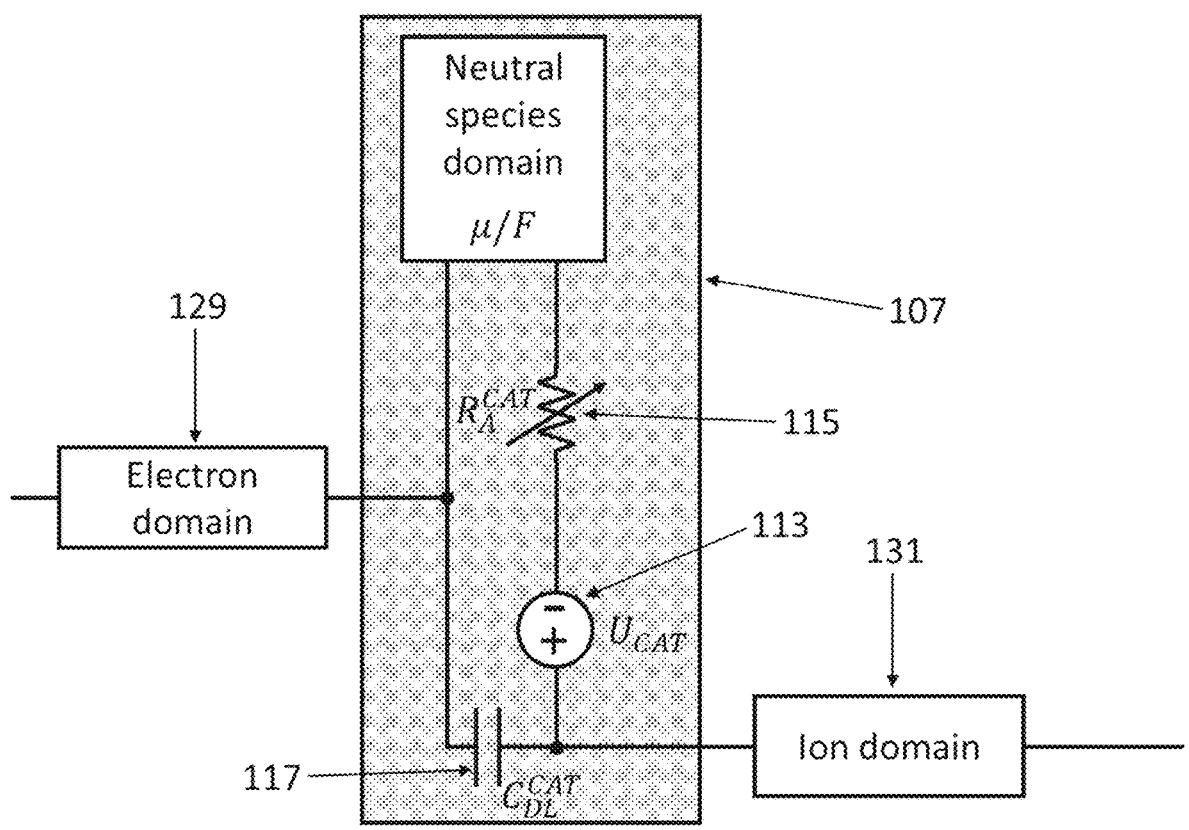
FIG. 3 shows schematically a topological representation of surface processes with equivalent circuit elements to couple electron, ionic and neutral species domain, which is for information purposes plotted for a cathode, whereas an identical topology can also be applied for an anode.

A non-restrictive example will be elaborated with reference to FIG. 3 and on a basic set of equations, whereas an extension to more complex equations is intuitive. Combining facts that potential difference across double layer, see double layer capacitance 117 in FIG. 3, equals difference between solid and electrolyte potential (equation (12)) as well as combining this with equation of half redox reaction at the electrode (equation (8) and (9)) yields the following equation $$\phi_S - \phi_{ely} = \tilde{U}_{OCV} - \eta = U_{OCV} - \frac{\mu(c_s^0)}{F} - \eta = -U_{DL}, \quad (13)$$

which in the case of no current further simplifies to $$\phi_S - \phi_{ely} = \tilde{U}_{OCV} = U_{OCV} - \frac{\mu(c_s^0)}{F} = -U_{DL}. \quad (14)$$

Equation (14) indicates that double layer capacitance 117 ($C_{DL}^{CAT}$) needs to be positioned in parallel to the half redox reaction at the surface as depicted in FIG. 3. This is in-line with WO 2016/151336 A1 and (Von Srbik, et al., Journal of Power Sources, 325: 171-184, 2016), whereas this is also a logical consequence of the fact that in the case where no current flows, electrochemical potential through the solid-electrolyte interface is equal. This means that the sum of chemical potential, which is driven by the differences in the Gibbs free energy across the surface and yields $\tilde{U}_{OCV}$, is equal to the electrical potential, which originates from the double layer. Another important consequence of equation (8) and (13) is the need to connect in series to voltage source 113 and at least one resistor 115 ($R_A^{CAT}$), which virtually replicates overpotential ($\eta$) due to surface reactions, as discernible from FIG. 3.

A third challenge arises from proper integration of $\mu(c_s)$. In this non-restrictive example, identity $\tilde{U}_{OCV} = U_{OCV} - \mu(c_s^0)/F$ can be interpreted in a way that actual $\tilde{U}_{OCV}$, which is depended on the surface concertation of intercalating species ($c_s^0$), is written as a combination of $U_{OCV}$, which is constant and which can be interpreted as an $\tilde{U}_{OCV}$ at a certain reference surface concentration, e.g. $c_{s,ref}^0$, and $\mu(c_s)/F$, which accounts for the variation of $\tilde{U}_{OCV}$ as a function of concertation of intercalating species, as represented in FIG. 3. However, other expressions for expressing $\tilde{U}_{OCV}$ can also be derived as addressed later. In FIG. 3, $\mu(c_s^0)/F$ is represented by the element $\mu/F$ and $U_{OCV}$ by element $U_{CAT}$. This topology marked with box in FIG. 3 relates to a sub-circuit model 107 and complies with the above requirement on such a topology of the equivalent circuit that it complies with governing potential equations at the interface between the active material, electron conductive material and electrolyte.

In this paragraph, it will further be explained that such a topology also complies with requirements that all three species are represented in a single circuit build of electrical elements and that all three species are subjected to adequate governing forces. It is intuitive that charged ions and electrons can be represented with a single electric network. These domains are in the FIG. 3 denoted as electron and ion domain 129, 131 and they will in the following elaboration represent anchor elements for connection to electrode conduction domain, e.g. current collector and electron conductive material in the case of Li-ion batteries (second current inlet 111), and electrolyte domain (first current inlet 109) respectively.

Moreover, in the electric circuit analogue proper driving forces can be derived for the electron and ion domain, which will be in detail elaborated further in the document.

Considering transport of neutral species, e.g. Li in the case of Li-ion batteries but also any other intercalating species in any other type of batteries, and corresponding driving forces, it is well elaborated that gradient of the chemical potential is the driving force for their transport and that in return, active material changes its chemical potential upon variation of concentration of intercalating species (Liu, et al., Materials Today, 19.2: 109-123, 2016; Burch & Bazant, Nano Letters, 9.11: 3795-3800, 2009). It is also well elaborated that surface concentration of the active material determines $\mu(c_s)$ for the half redox reaction. Therefore, in this simplified explanation $\mu(c_s^0)$, will be used to represent chemical potential at the surface. This calls for an adequate transport model in the active material, where transport of neutral species is subjected to gradient of the chemical potential. Such a transport model, adequately represented by electric circuit, is only possible due to the fact that chemical potential is measured in units of electron—Volts per quantity of particles. Therefore, it can simply be transformed into the electric potential in a straightforward manner, by dividing it with Faraday constant (equation 13 and 14). This transport model will be elaborated in detail later in the document, whereas, as reasoned, positioning of the $\mu(c_s^0)$ in series to the $U_{OCV}$, as presented in FIG. 3, closes the problem. This equivalent circuit namely features adequate potential difference between the solid and the electrolyte, as it considers actual material specific and concentration dependent potential difference inherent to half redox reaction at the electrode. $\tilde{U}_{OCV}$, and as it properly couples charged and uncharged particle and corresponding driving forces. Driving force for transport of neutral species is namely gradient in the chemical potential, which, if assuming simplified example of initial constant concentration in active material, will be stimulated by any addition or subtraction of neutrals species, being created upon reaction between the electron and ion, to or from the active particle. This will in turn change its surface chemical potential as a function of concentration variation, $\mu(c_s)$.

Thereby, circuit topology proposed in FIG. 3 enables replication of the process, where ions and electrons react at the surface and enter active particle, where they are subjected to transport according to the gradient of the chemical potential. This is properly virtually represented by $U_{OCV}$, reaction specific surface overpotentials, $\eta$, variation of $\mu(c_s^0)$ and associated double layer voltage drop $U_{DL}$ (Equation 12). Subsequent derivations will derive in detail elements and processes, which are needed to generate innovative equivalent circuit topology that preserves consistently to physiochemical processes in real batteries thereby ensuring their consistency with electrochemical models.

The system of equations of porous electrode theory (Equations (1)-(11)) can be transformed to equivalent circuit representation using following derivation.

Mass conservation in active material is represented by equation (1). It is in the form of second Fick's law of diffusion, describing the concentration field of lithium inside active electrode material. Description of the diffusion phenomena by the equivalent circuit representation is fully described in paper by Jamnik et. al (Jamnik & Maier, Physical Chemistry Chemical Physics, 3.9:1668-1678, 2001). If approaches described in reference (Jamnik & Maier, Physical Chemistry Chemical Physics, 3.9: 1668-1678, 2001) are applied to the Equation (1), equivalent circuit with the specific topology is obtained that fully describe the temporal evolution of concentration inside electrode active particles during battery operation. First Equation (1) is broken down into the form of two equations: continuity equation and first Fick's law:

$$\frac{\partial c_s}{\partial t} = \nabla \Phi_{Li} \tag{15}$$

and $$\phi_{Li} = D_s \nabla c_s, \tag{16}$$

where $\phi_{Li}$ is lithium flux inside active particle. Next the discretization of both differential equations ((15) and (16)) is performed, following the procedure of finite volume discretization. In this non-restrictive example, this derivation will be conducted for one dimensional case for the demonstrational purposes and simplicity but it can be generalized to any dimensionality. By integration across each control volume of chosen discretization and use of divergence theorem Equation (15) and (16) are transformed to the system of ordinary differential equations (ODEs) that can be interpreted as Kirchhoff laws of the corresponding equivalent circuit. Obtained systems of ODEs reads:

$$\frac{\partial c_s^i}{\partial t} = \frac{1}{\Delta z}\left(\Phi_{Li}^{i+1/2} - \Phi_{Li}^{i-1/2}\right) \tag{17}$$

and $$\Phi_{Li}^{i+1/2} = \frac{D_s}{\Delta z}\left(c_s^{i+1} - c_s^i\right), \tag{18}$$

where i represents the index of control volume. Dividing equations (17) and (18) by Faraday constant and multiplying them by control volume, equations are transformed to electrical domain connecting electric currents and charge instead of molar fluxes and concentrations. Obtained equations in electrical domain can be written as:

$$\frac{\partial q_s^i}{\partial t} = I_s^i = I_s^{i+1/2} - I_s^{i-1/2} \tag{19}$$

and $$I_s^{i+1/2} = \frac{D_s}{\Delta z^2}\left(q_s^{i+1} - q_s^i\right). \tag{20}$$

Figure 4:
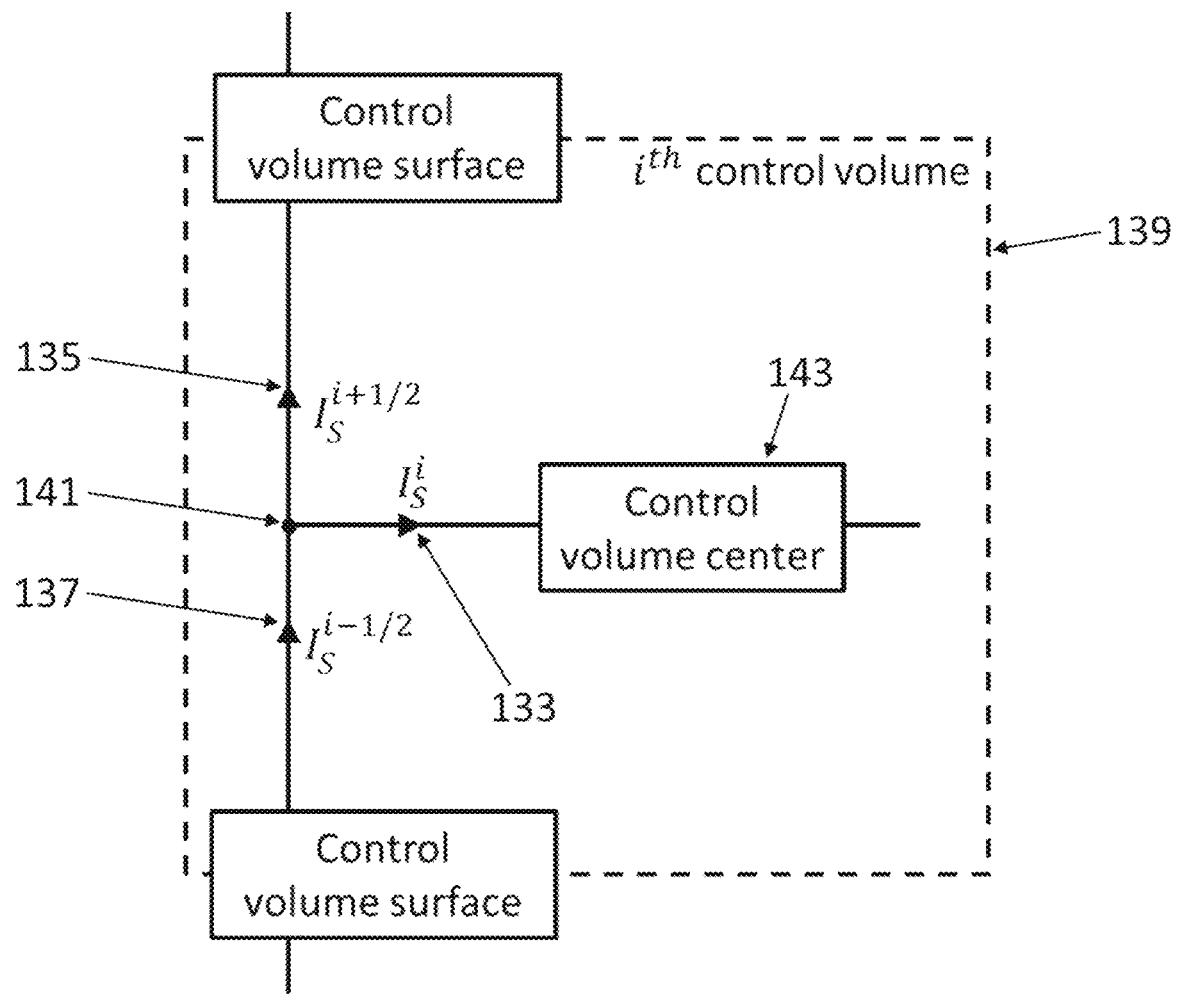
FIG. 4 shows schematically a portion of a circuit node of an electric circuit model, wherein the node is represented by equation (19).

As illustrated in FIG. 4, equation (19) describes the relation between currents 133, 135, 137 at the center of a control volume 139 and currents across the control volume surfaces. It can be interpreted as Kirchhoff current law for the node with three branches. Two branches driving current out (currents 135, 137) and one branch driving current 133 into the node 149 (see FIG. 4).

Equation (20) provides the insight into the nature of the electric circuit elements that constitute all three previously mentioned current branches and replicate real processes in the active material. The charge storage at the centers of control volumes ($q_s^i$ and $q_s^{i+1}$) implies the description of control volume center 143 as capacitor, whereas current at the control volume surface implies the description of surface as ohmic resistor. Proportionality coefficient accounts for:

$$\frac{D_s}{\Delta z^2} = \frac{1}{R_s^{i+1/2} C_s^i}, \tag{21}$$

where $R_s^{i+1/2}$ represents the resistivity of control volume surface and $C_s^i$ is capacitance of control volume, equation (20) can be transformed to the form:

$$U_s^{i+1/2} = U_s^{i+1} - U_s^i. \tag{22}$$

Equation (21) includes the information about topology since it can be interpreted as finite loop inside electric circuit that obeys Kirchhoff voltage law, which states that sum of all voltage drops inside a finite loop must equal zero. Equation (19) and (21) together represent the system of the algebraic equations that uniquely determine the electric circuit presented in FIG. 1.

The description of the diffusion phenomena by transmission lines in FIGS. 5 to 8 show unambiguous physiochemical consistency in the case when chemical capacitors are used in the circuit (Jamnik & Maier, Physical Chemistry Chemical Physics, 3.9: 1668-1678, 2001). Chemical capacitors, in comparison to classic electro-technical capacitors, exhibit non-linear relation between voltage and charge (i.e. are characterized by non-constant capacity). More precisely, in a theoretical case, relation between voltage and charge obeys logarithmic dependency as dictated by the Nernst equation (Ferguson & Bazant, Journal of The Electrochemical Society, 159.12: A1967, 2012). However, chemical capacitors are much more demanding for implementation within equivalent circuits in comparison to classic electrotechnical capacitors. Classic capacitors namely ensure simplicity of implementation and extremely low computational efforts when implemented in the simulation models.

Nonetheless, it is also presented in the literature (Von Srbik, et al., Journal of Power Sources, 325: 171-184, 2016) that incorporation of classic capacitors with constant capacity within transmission line models enables plausible modelling of transport properties in the active material. Due to non-identical dependency of potential vs. capacity of chemical capacitors in comparison to classic capacitors, classic capacitors do not feature the same value of the chemical potential divided by Faraday constant ($\mu(c_s^0)/F$). Disclosed invention can thus also be applied by incorporating classic capacitors in a way that eq. (9) is reformulated as $$\tilde{U}_{OCV} = U_{OCV} - \frac{\mu(c_s^0)}{F} = U_{OCV} - \frac{\mu_{non\ linear}(c_s^0)}{F} - \frac{\mu_{linear}(c_s^0)}{F} = \left(U_{OCV} - \frac{\mu_{non\ linear}(c_s^0)}{F}\right)_{OCV\ source} - \left(\frac{\mu_{linear}(c_s^0)}{F}\right)_{capacitor} \quad (23)$$

where $$\left(\frac{\mu_{linear}(c_s^0)}{F}\right)_{capacitor}$$

represents characteristics of a classical capacitor 117 and $$\left(U_{OCV} + \frac{\mu_{non\ linear}(c_s^0)}{F}\right)_{OCV\ source}$$

is integrated in OCV source element, e.g. $U_{CAT}$ element 113 in FIG. 1. Therefore, when referring to active material, notation of capacitor covers a chemical and a classical capacitor.

When interpreting transport of neutral species as transport of polarons consisting on an ion and an electron, the obtained equivalent circuit can be further rearranged in a way that it still preserves full consistency with the derived equations (21) and (22). Resistance $R_s^{i+1/2}$ can be divided in two parts $R_s^{i+1/2} = R_{s,ION}^{i+1/2} + R_{s,el}^{i+1/2}$. Each of these parts can be interpreted as the resistor at each rail of transmission line (FIG. 2). $R_{s,ION}^{i+1/2}$ determines mobility properties of ions in active material and $R_{s,el}^{i+1/2}$ corresponds to mobility properties of electrons in active material.

Figure 5:
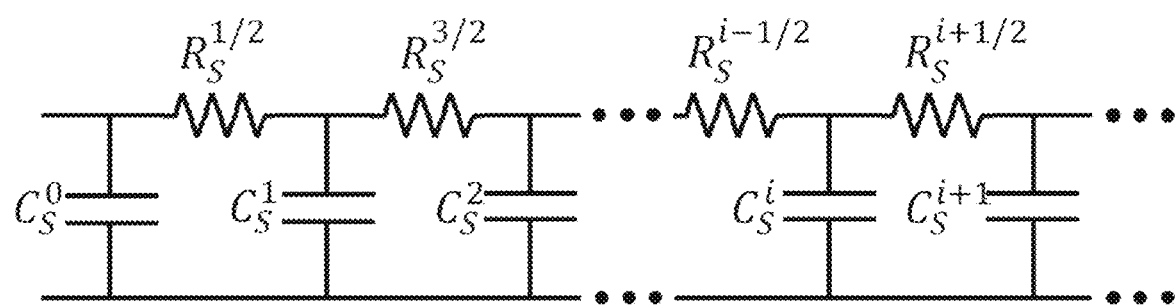
FIG. 5 shows schematically a transmission line equivalent circuit for diffusion in active material for use in an electric circuit model of a battery.
Figure 6:
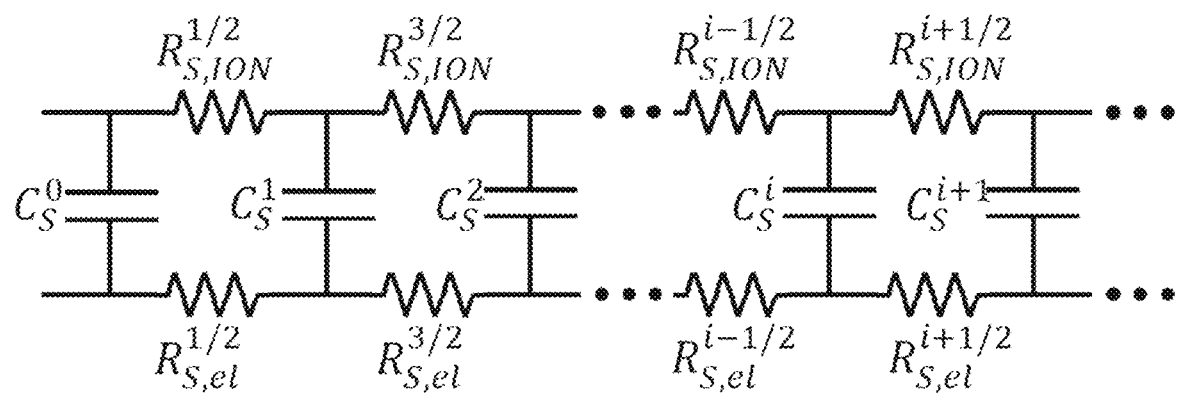
FIG. 6 shows schematically a transmission line equivalent circuit for diffusion in active material with divided description of ion and electron mobility properties for use in an electric circuit model of a battery.

Both descriptions from FIGS. 5 and 6 are equivalent since the distribution of resistors among both rails of transition line does not influence the charge distribution among the capacitors and consequently chemical potential in active material, as long as relation $R_s^{i+1/2} = R_{s,el}^{i+1/2} + R_{s,el}^{i+1/2}$ is satisfied. The usual approach for the description of diffusion in active material is transition line in FIG. 5 (Jamnik & Maier, Physical Chemistry Chemical Physics, 3.9:1668-1678, 2001; Warburg, Annalen der Physik, 493-499, 1899; Von Srbik, et al., Journal of Power Sources, 325: 171-184, 2016) since ion and electron are coupled during migration and mobility coefficient can be reduced to ion resistance only (Ellis, et al., Journal of the American Chemical Society, 128.35: 11416-11422, 2006) (i.e. $R_{s,ION}^{i+1/2} \gg R_{s,el}^{i+1/2} \rightarrow R_s^{i+1/2} \approx R_{s,ION}^{i+1/2}$. This distinction will be most important later in the section of electrolyte, where resistors represent the migration properties of positive and negative ions.

FIGS. 5 and 6 show two possible equivalent circuits of the bulk active material. If plausible description of the active particle wanted to be obtained, boundary conditions need to be introduced to the models presented in FIGS. 5 and 6. Very common way of boundary condition implementation to the transition line equivalent circuit that represent the active particle is so called Warburg impedance equivalent circuit. Nevertheless, Warburg impedance circuit is designed for half infinite active particle (lithium concentration at infinity is set to constant value). In the FIG. 7 alternative circuit is presented, that more realistically describe active particle. It can be derived from equations (9) and (10) that are reformulated by the same procedure as described above for the equations (15) and (16) (i.e. integrated across control volume and divided by Faraday constant) Kirchhoff laws are obtained that imply the topology of equivalent circuit that simultaneously satisfies equations (1) (9) and (10). This is, therefore, complete electric circuit analogue of the electrode active particle. It is presented in FIG. 7.

Elements denoted by $U_{OCV}$, $R_{ION}$ and $R_{el}$, correspond to the equation (7), that enters the system of equations (1) and (9) through equation (10). Considering specifics of the modelled system, $U_{OCV}$ (represented by $U_{CAT}$ in FIG. 3) might represents potential due to half redox reaction, i.e. $\tilde{U}_{OCV}$, or any of the OCV related parts in equations 23. $R_{ION}$ and $R_e$ are resistances of the active particle surface for the ion and electron transferee across the interface. Both resistors ($R_{ION}$ and $R_{el}$), therefore, represent the potential drops for ions and electrons across active particle surface. These two resistances consist of several different contributions and will later be divided in the series of variable resistors each describing a distinct electrochemical contribution to the total active particle surface resistance.

In the literature several different possibilities for the description of active particle can be found (Von Srbik, et al., Journal of Power Sources, 325: 171-184, 2016; Li, et al., Electrochimica Acta, 299: 451-469, 2019), depending on the used boundary conditions, geometry of particle and depth of desired accuracy of description. Modularity of equivalent circuit presented in this patent allows the use of any of those not just the one presented in FIG. 7. Different possibilities of equivalent circuit representations of the active particle are presented in FIG. 8.

The procedure of transformation of equation (2)-(4) to the electric circuit representation will follow the exact same procedure as described for the equation (1) in this section. That is why all the derivation steps will not be explicitly written out in the following sections.

Charge conservation in the electron conductive material. In the case of Equation (2) transformation to electric circuit representation, control volume integration and derivation of equation by Faraday do not directly provide Kirchhoff laws for electric circuit. Additional equation is needed that links electric potentials in electron conductive material to electric voltages in electric circuit. By the definition, electric voltage is the difference between electric potentials in two points in space. In spite of finite volume discretization (i.e. integration across each control volume) electric voltage can be written as $U_{ECM}^{j+1/2}=\phi_s^{j+1}-\phi_s^j=\Delta x \nabla \phi_s$. Note that in this case discretization runs across the electrode and not across active particle, therefore, it is indexed by new index j, which now represents the position inside electrode along the electrode thickness direction (see FIG. 9).

Taking into account aforementioned relation between voltage and potential, equation (2) in the equivalent circuit representation can be seen as a series of resistors. This is also intuitively in line with equation (2) since this equation describes electron conductive material by Ohm's law.

Side branches are attached to this resistor series between neighboring resistors (see FIG. 6). This side branches represent the current source term which is electron current to the electron conductive material due to reaction at the surface of active particle (right hand side of equation (2)). Resistances $R_{ECM}^j$ (subscript ECM meaning electron conductive material) in FIG. 10 are linked to the material property of electron conductivity of electron conductive material and can be written as:

$$R_{ECM}^j = \frac{\Delta x}{A \sigma^{eff}}, \tag{24}$$

where A represents the cross-section surface of electrode perpendicular to the coordinate x.

Additional electric element (capacitor) denoted by $C_{DL}^j$ was introduced in FIG. 10 to satisfy the right hand side of equation (2). It is the element responsible for the description of double layer lithium molar flux and will be explained later in text.

Mass and charge conservation in the electrolyte. Equations (3) and (4) need to be solved simultaneously since they are implicitly coupled through two variables and not only boundary conditions as in case of equation (1) and (2). If both equations are integrated and divided by Faraday constant (procedure described in section of mass conservation in active material), Kirchhoff law equations for two nodes in the circuit are obtained. Similarly, to the case of mass conservation in active material, two equations interrelating voltages on the equivalent circuit elements are also obtained in these procedures.

FIG. 11 shows the electric circuit that is obtained if all derived Kirchhoff laws are taken into account. Quantities $R_{ely+}^j$ and $R_{ely-}^j$ correspond to the transport properties of electrolyte for positive and negative ions. Parameters of the equivalent circuit represented in the FIG. 11 can be written as:

$$R_{ely+}^j = \frac{\Delta x}{A(1-t_+)\kappa_{ely}^{eff}} \tag{25}$$

$$R_{ely-}^j = \frac{\Delta x}{A t_+ \kappa_{ely}^{eff}} \tag{26}$$

$$C_{ely}^j = \frac{\Delta x t_+(1-t_+)\kappa_{ely}^{eff}}{A \varepsilon D_{ely}^{eff}} \tag{27}$$

The origin of capacitor $C_{DL}^j$ comes from the equation (6). The corresponding quantity to the $\phi_{ely}$ in the electric circuit representation is the voltage difference between $R_{ely-}^{j-1/2}$ and $R_{ely-}^{j+1/2}$. The relationship between $\phi_s$ and potential drop on $R_{ECM}^j$ is described in section Charge conservation in electron conductive material. Both relationships introduced in equation (6) yield the equation of capacitor $$\frac{\Delta x L \tilde{C}_{DL}}{A \alpha \varepsilon} \frac{\partial U_{DL}^j}{\partial t} = I_{DL}^j, \tag{28}$$

defining the capacitance of capacitor as $$C_{DL}^j = \frac{\Delta x L \tilde{C}_{DL}}{A \alpha \varepsilon}. \tag{29}$$

Electrolyte elements will be explicitly used when connecting multiple active particles in a single electrode.

The Interconnect can be represented with the same topology as the electrolyte with two differences. First, in some embodiments, elements of the interconnect are not connected to active particles, as there are no active particles in the electrolyte. Second, elements representing the interconnect might feature different values than those encountered in the elements representing the electrolyte due to different geometric, e.g. porosity, and transport properties of the separator region that is modelled by the interconnect. Possibilities for representing the interconnect are shown in FIG. 12. Electrolyte element can be used when assembling the model of the entire battery comprising positive and negative electrode.

Figure 7:
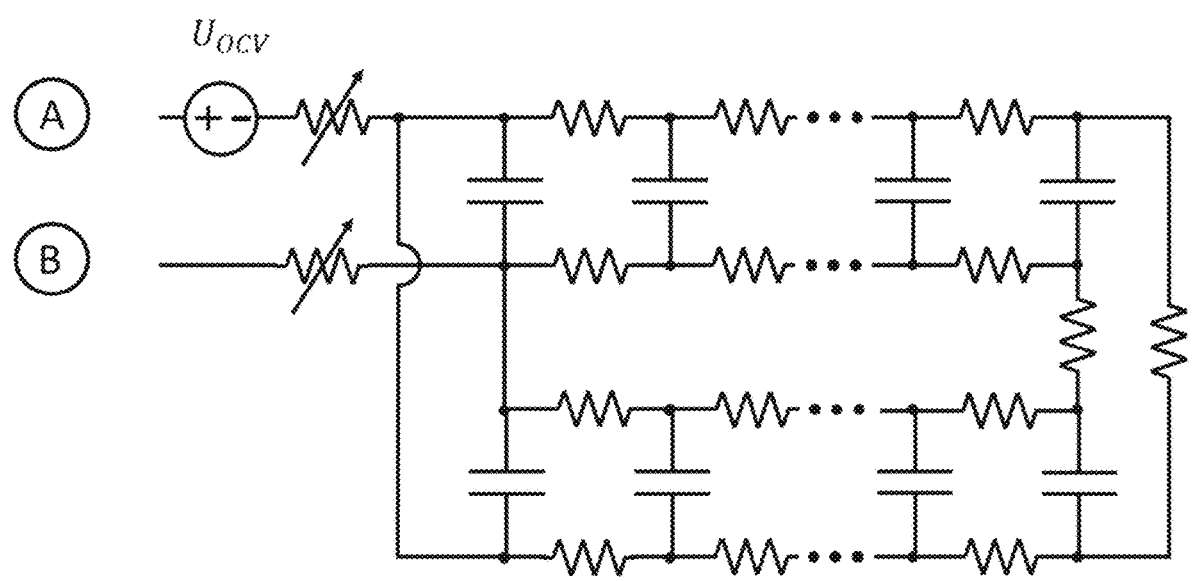
FIG. 7 shows schematically a transmission line equivalent circuit for of electrode active particle properties for use in an electric circuit model of a battery.

Final equivalent circuit in a multi-particle single electrode is obtained by connecting wires labeled with circled A in FIGS. 7 and 11, wires labeled by circled B in FIGS. 7 and 10 and wires labeled by circles C in FIGS. 10 and 11. This way all boundary conditions are correctly satisfied. Final version of the battery electrode equivalent circuit is obtained that represent the electric circuit mapping of the equations (1)-(11) (see FIG. 13).

Active particles are presented as representative boxes, which might be represented by any topology presented in FIG. 8.

Equations (21), (24)-(27) and (29) represent the consistent mapping of parameters of derived equivalent circuit to the original porous electrode theory parameters.

In order to assemble whole battery from the designed electrode in FIG. 13, few elements that link both electrodes in battery need to be described. These are the elements that allow the different choice of circuit for its description, depending on the desired depth of accuracy.

Current collector can be represented only by a resistor or a parallel connection of a resistor and an inductor to cover also inductance effects as shown in FIG. 14. In a more complex topological representation, where for example more than one dimension should be represented by the model, it is possible to arrange resistors and an inductor also in parallel.

As batteries are generally used to power a broad spectrum of loads, while secondary batteries are also being charged. All the devices that are connected to a battery during its discharge or charge procedure are in this non-restrictive example represented by Load.

Load, therefore, represents any possible device through which battery discharges and any possible device for charging the battery. Some very basic elements representing load are in the non-restrictive manner presented in FIG. 15.

Battery Equivalent Circuit

A battery that consists of two electrodes, a separator, if applicable, and current collectors can now be assembled from porous electrode equivalent circuit designed in previous section. First circuit in FIG. 16 represents the battery equivalent circuit model, which is assembled by connecting two electrodes from FIG. 13 across the interconnect. At least in some embodiments, it is the most general full model, with many active particles in each electrode. These particles can be connected to electrolyte and electron conductive sub-circuit in series as presented in FIG. 16, or also in parallel, where connectivity type determined the dimensionality of the spatial resolution of the electrode. Beside topologically correct description of all physio-chemical processes, this circuit also features spatial resolution and, therefore, accounts for spatially dependent transient phenomena (i.e. potential and concentration gradients inside electrodes and active particles).

Referring back to FIG. 1, a simpler possible model of battery is presented that besides only one active particle per electrode reduces also the complexity of active particle to only one variable resistance for ions at the particle surface (as described in section»mass conservation in active material«).

FIG. 17 shows a similar model to FIG. 1, but with the more general description of particle surface that includes several different contributions (i.e. activation overpotential, passivating layer, solid electrolyte interphase, and several other possible contributions that can potentially be introduced into the model). This is basically reflected in the implementation of FIG. 17 that a plurality of resistors R are arranged in series in the first current path. Each resistor can be associated with a particular contribution as mentioned before.

Implementation and Use of Model

Implementation of an embodiment of an equivalent circuit model of a battery in a data processing system can provide advantages and benefits for modelling and/or simulating the battery due to preserved consistency to physiochemical processes in real batteries:

As illustrated in FIG. 18, a topological representation of the battery (S1) that corresponds to the real topological representation of the battery is an input to the data processing system. Despite basic connectivity rules presented in FIG. 19 and mandatory topological representation of surface processes with equivalent circuit elements to couple electron, ionic and neutral species domain (FIG. 3), topological representation of the overall equivalent circuit representing the battery might vary based on the intended application of the model.

Differences in topological representation of the battery with the equivalent circuit model can, within preserved physiochemical consistency, comprise differences in arranging sub-circuit within the equivalent circuit model and differences in arranging topology of sub-circuits. Differences in arranging sub-circuit within the equivalent circuit model are for example discernible by comparing topologies in FIG. 1 and FIG. 16, where FIG. 16 comprises multiple particles in the cathode and the anode.

Thereby, electrode can be modelled with different spatial resolution, where sub-division of electrode into multiple particles enables modeling gradients in the electrodes. Differences in arranging topology of sub-circuits for example comprise variation in number of resistances representing the over-potentials in the first current path 119, which might be varied to additionally resolve for example effects of passivating films as discernable from comparison of FIG. 1 and FIG. 17. In addition, several topologies of sub-circuits for active particles and electrolyte as well as interconnect can be selected as presented in FIGS. 8 and 12 respectively. Furthermore, current collector and the load can also be modelled with sub-circuits (FIG. 14).

These differences in topological representation of the battery with the equivalent circuit influence model results in specific regimes of model operation, e.g. in transient response or response to AC stimuli. Therefore, a user of optimisation algorithm can, within physio-chemically consistent embodiments of those domains, determine most suitable arrangement of sub-circuit within the equivalent circuit model topology and/or sub-circuit topology based on the intended applications.

A model comprises topological representation of the battery and model parameters, which represent values (fixed or variable) of resistances, conductances, inductances and voltage sources in all elements of all sub-circuits. These parameters values can be determined via three approaches as presented in FIG. 18: 1. by analytical evaluation, 2. by model parameter identification techniques applied to data sets of DC and/or AC measurements, and 3. by the combination of both approaches. In the analytic evaluation, analytical equations, elaborated in this document to demonstrate one non-restrictive embodiment, are used to evaluate parameters of all elements in the equivalent circuit model (see step S3 in FIG. 18) based on geometric, physical and chemical properties of the battery (see step S2 in FIG. 18), under consideration of the topology of the model (S1). In another approach, the user might use data sets of DC and/or AC measurements (i.e. use of data sets in time and/or frequency domain) to parametrize the model (see step S4 in FIG. 18). In this case, various parametrization and optimization algorithms can be applied to determine model parameters via model parameter identification techniques (see step S5 in FIG. 18). The third approach comprises combination of both methods, where, in a non-restrictive example presented in FIG. 18, analytical evaluation can be applied first and in the next steps all or selected parameters can be refined via the model parameter identification techniques applied to experimental data to obtain a closer match between model results and experimental measurements. The third might comprise also other order of combining analytical evaluation of model parameters and model parameter identification techniques.

Such a model comprising topological representation of the battery and model parameters is then used by the user to simulate battery performance (DC and AC, i.e. simulation in time and frequency domain).

After validation of the model, the user or a computer algorithm might decide if results are adequate and end the procedure, whereas, if results are not adequate, a model can be improved. Model improvement can be executed by the user or by a computer algorithm, which executes particular steps based on the implemented decision-making algorithm, identified deficiencies in the validation procedure and availability of the data for model parametrization as well as the mode of parametrization (S2 and S3 or S4 and S5 in FIG. 18). During model improvements one, or more or all steps from S1-S5 can be entered to change the model topology or model parameters with an aim to obtain high quality results for the intended application of the model.

Due to its consistency with physiochemical processes in real batteries and due to capability of parametrization via analytical evaluation and/or model parameter identification techniques applied to measured DC/AC data, the described model can be applied over the entire V-development process. It can be applied in early concept, system and components design studies. It can be used in various HiL and system and component validation studies. Likewise, it can be used in battery diagnostics, and it can be applicable also in BMS (Battery management systems). Moreover, if integrated with specific hardware the model can be used battery emulator.

In addition, a topological representation of the model, which consistently virtually replicates physiochemical phenomena in batteries, enables more unique determination of model parameters from experimental data and thus enhances ease of parametrization and increasing accuracy of determined parameters. Ease of parametrization is further enhanced through the capability to parametrize the models via time and frequency domain data. Therefore, the described model forms a more adequate and accurate basis for SoX observers thus enabling more accurate determination of degradation relevant parameters and hence more accurate battery control, which has a significant value in advanced BMS systems. The model can also form a more adequate and accurate basis for office and analytic applications when analysing and interpreting experiments results measured in time and/or frequency domain and, in addition, these features for a basis also for an advanced battery emulator.

LIST OF REFERENCE SIGNS 101 model electric circuit
103 model of cathode
105 model of anode
107 sub-circuit model
109 first current inlet
111 second current inlet
113 voltage source
115 resistor
117 capacitance
119 first current path
121 second current path
123 current collector model
125 interconnect model
127 load model
129 electron domain
131 ion domain
133 current
135 current
137 current
139 control volume
141 node
143 control volume
145 model of active particle
147 third current inlet
149 fourth current inlet
151 capacitance
153 capacitance
155 resistor
157 fifth current inlet
159 sixth current inlet
161 resistor
163 conduction line
165 conduction line
167 conduction path
169 electrolyte model
171 electrolyte model
173 ninth inlet
175 inlets
177 resistor
179 resistor
181 capacitance
183 current inlet
185 current inlet
187 resistor
189 resistor
191 inductance
193 resistor
195 seventh current inlet
197 eighth current inlet
199 voltage source
201 current source
203 resistor
205 separator
207 point
209 point

The invention claimed is:

1. A computer-implemented method for modelling and/or simulating and/or emulating a battery, the method comprising:
generating an equivalent electric circuit model of a battery,
wherein the equivalent electric circuit model includes a model of a cathode of the battery, and a model of an anode of the battery, wherein at least one of the models of the cathode and anode comprises one or more sub-circuit models, and
wherein a sub-circuit model from the one or more sub-circuit models comprises a first current inlet, a second current inlet, at least one voltage source, one or more resistors, and a capacitance,
wherein a first current path is arranged between the first current inlet and the second current inlet,
wherein the at least one voltage source and the one or more resistors are arranged in series in the first current path,
wherein the first current path includes a model of an active particle sub-circuit, the model of the active particle sub-circuit having a third current inlet and a fourth current inlet which are arranged in series in the first current path,
wherein a second current path is arranged in parallel to the first current path between the first current inlet and the second current inlet, and
wherein the capacitance is arranged in the second current path.

2. The method of claim 1, wherein
the sub-circuit model is associated with an interface in the anode or cathode between active particle, electron conductive material and electrolyte, and
the at least one voltage source provides an electric potential which corresponds to half a redox reaction on the surface of the active particle, and
the one or more resistors replicate an electric overpotential due to surface reactions at the interface between the active particle, the electron conductive material and the electrolyte, and the capacitance replicates double layer capacitance of the active particle and electron conductive material against electrolyte and each of the one or more resistors is a variable resistor.

3. The method of claim 1, wherein
the model of the active particle sub-circuit includes at least a capacitance arranged between the third and fourth current inlet.

4. The method of claim 3,
wherein the model of the active particle sub-circuit includes a plurality of capacitances arranged in parallel between the third and fourth current inlet,
wherein two neighbouring parallel capacitances are connected with each other by two current paths running in parallel with each other, and wherein at least one of the two current paths comprises a resistor.

5. The method of claim 1,
wherein the equivalent electric circuit model includes a model of an electrolyte for the cathode which interconnects the first current inlets of the one or more sub-circuit models of the cathode with a model of an interconnect, and the equivalent electric circuit model includes a model of an electrolyte for the anode which interconnects the first current inlets of the one or more sub-circuit models of the anode with the model of the interconnect,
wherein the model of the electrolyte for the anode corresponds to the model of the electrolyte for the cathode.

6. The method of claim 5,
wherein the model of the electrolyte for the cathode comprises a ninth inlet for connecting to the interconnect and a plurality of inlets for connecting to the sub-circuit models,
wherein each inlet of the plurality of inlets is connected with a respective first current inlet of a respective sub-circuit model from the one or more sub-circuit models.

7. The method of claim 6,
wherein at least one resistor is arranged in series between each inlet from the plurality of inlets and the ninth inlet, or the model of the electrolyte includes at least a first conduction path and a second conduction path in parallel to the first conduction path, wherein the first conduction path includes a set of resistors arranged in a series, wherein the second conduction path includes a set of resistors arranged in a series, wherein a current path exists between the first and second conduction path after each resistor of the first conduction path and each resistor of the second conduction path, wherein each current path includes a capacitance.

8. The method of claim 1, wherein the equivalent electric circuit model includes a model of an interconnect which is configured to model an ion transport between the anode and the cathode.

9. The method of claim 8, wherein
the model of the interconnect comprises at least one fifth current inlet and at least one sixth current inlet, which are arranged between the first current inlet of the one or more sub-circuit models of the model of the cathode and the first current inlet of the one or more sub-circuit models of the model of the anode, or the at least one fifth and sixth current inlets of the interconnect model are arranged between a ninth inlet of a model of an electrolyte of the cathode and a ninth inlet of a model of an electrolyte of the anode.

10. The method of claim 9, wherein
at least a resistor is arranged in series between the fifth current inlet and the sixth current inlet of the model of the interconnect, or
the model of the interconnect includes two parallel conduction lines, one conduction line including a set of first resistors arranged in a series, and the other conduction line includes a set of second resistors arranged in a series, wherein the two parallel conduction lines are arranged between a fifth current inlet and a sixth current inlet, and wherein a conduction path extends after each resistor of the set of first resistors and each resistor of the set of second resistors between the two conduction lines, and wherein each conduction path includes a capacitance.

11. The method of claim 1,
wherein the equivalent electric circuit model includes one or more models of an electric current collector,
wherein an electric current collector, from the one or more models of the electric current collector, on the cathode side comprises at least two current inlets with at least one of the current inlets being connected to the second current inlet of the sub-circuit of the cathode, or
wherein an electric current collector, from the one or more models of the electric current collector, on the anode side comprises at least two current inlets with at least one of the current inlets being connected to the second current inlet of the sub-circuit of the anode,
wherein each of the one or more models of the electric current collector comprises at least one resistor arranged between the two inlets of the current collector, or each of the one or more models of the electric current collector comprises at least one resistor and at least one inductance, which are arranged in series or in parallel between the two inlets of the current collector model.

12. The method of claim 11, wherein
at least one resistor is arranged between the electric current collector on the cathode side and the second current inlet of the sub-circuit of the cathode, or
at least one resistor is arranged between the electric current collector on the anode side and the second current inlet of the sub-circuit of the anode.

13. The method of claim 1, wherein if more than one sub-circuit model is provided for the cathode or anode the sub-circuit models of the respective cathode or anode are arranged in series or in parallel with each other.

14. The method of claim 1,
wherein the equivalent electric circuit model includes a model of an electric load having a seventh current inlet and an eighth current inlet, which interconnect the second current inlet of the one or more sub-circuit models of the cathode and the second current inlet of the one or more sub-circuit models of the anode,
wherein an electric current collector on the cathode side comprises two current inlets with one of the two current inlets being connected via at least one resistor to the second current inlets of the one or more sub-circuits of the cathode and with the other of the two current inlets being connected to the seventh current inlet of the electric load,
wherein an electric current collector on the anode side comprises two current inlets with one of the two current inlets being connected via at least one resistor to the second current inlets of the one or more sub-circuits of the anode and with the other of the two current inlets being connected to the eighth current inlet of the electric load,
wherein the model of the electric load includes at least one sink or at least one source configured to discharge or charge the battery, the sink or source is arranged in series between the seventh current inlet and the eighth current inlet.

15. The method of claim 14, wherein a set of numerical equations is provided that numerically describe the electrical interplay of the plurality of electric circuit elements, and
the method comprises using the equivalent electric circuit model, the set of numerical equations and the numerical equations associated with the electric circuit elements of the plurality of electric circuit elements to simulate the battery.

16. The method of claim 1, wherein the equivalent circuit model comprises a plurality of electric circuit models that form a model of a closed battery circuit with a load, and the method further comprises that each electric circuit element of a plurality of electric circuit elements that comprises the at least one voltage source, the one or more resistors and the capacitance of the at least one sub-circuit model, is associated with at least one numerical equation to map the respective electric circuit element to at least one parameter of the battery.

17. A general or a specially designed data processing apparatus with a dedicated hardware interface, the apparatus configured to:
  execute an equivalent electric circuit model of a battery, wherein the equivalent electric circuit model includes a model of a cathode of the battery, and a model of an anode of the battery, wherein at least one of the models of the cathode and anode comprises one or more sub-circuit models, and
  wherein a sub-circuit model from the one or more sub-circuit models comprises a first current inlet, a second current inlet, at least one voltage source, one or more resistors, and a capacitance,
  wherein a first current path is arranged between the first current inlet and the second current inlet,
  wherein the at least one voltage source and the one or more resistors are arranged in series in the first current path,
  wherein the first current path includes a model of an active particle sub-circuit, the model of the active particle sub-circuit having a third current inlet and a fourth current inlet which are arranged in series in the first current path,
  wherein a second current path is arranged in parallel to the first current path between the first current inlet and the second current inlet, and
  wherein the capacitance is arranged in the second current path.

18. A non-transitory computer-readable storage medium having stored therein a computer program comprising instructions which, when executed by a data processing apparatus with or without a dedicated hardware interface, cause the data processing apparatus to carry out a method, the method comprising:
  executing an equivalent electric circuit model of a battery, wherein the equivalent electric circuit model includes a model of a cathode of the battery, and a model of an anode of the battery, wherein at least one of the models of the cathode and anode comprises one or more sub-circuit models, and
  wherein a sub-circuit model from the one or more sub-circuit models comprises a first current inlet, a second current inlet, at least one voltage source, one or more resistors, and a capacitance,
  wherein a first current path is arranged between the first current inlet and the second current inlet,
  wherein the at least one voltage source and the one or more resistors are arranged in series in the first current path,
  wherein the first current path includes a model of an active particle sub-circuit, the model of the active particle sub-circuit having a third current inlet and a fourth current inlet which are arranged in series in the first current path,
  wherein a second current path is arranged in parallel to the first current path between the first current inlet and the second current inlet, and
  wherein the capacitance is arranged in the second current path.

* * * * *

UNITED STATES PATENT AND TRADEMARK OFFICE
CERTIFICATE OF CORRECTION

PATENT NO. : 11,480,616 B2
APPLICATION NO. : 17/721625
DATED : October 25, 2022
INVENTOR(S) : Tomaz Katrasnik et al.

It is certified that error appears in the above-identified patent and that said Letters Patent is hereby corrected as shown below:

On the Title Page

Item [30], insert:
--Oct. 2, 2020 (EP) ........................................ 20199967
Oct. 3, 2020 (LU) ........................................ LU102115--

Signed and Sealed this
Twenty-seventh Day of December, 2022

Katherine Kelly Vidal
*Director of the United States Patent and Trademark Office*